United States Patent
Hui et al.

(10) Patent No.: US 11,349,598 B2
(45) Date of Patent: May 31, 2022

(54) SPATIALLY COUPLED POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Songnam Hong, Yongin-si (KR); Ivana Maric, Stanford, CA (US)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 90 days.

(21) Appl. No.: 16/337,720

(22) PCT Filed: Sep. 29, 2017

(86) PCT No.: PCT/IB2017/056033
§ 371 (c)(1),
(2) Date: Mar. 28, 2019

(87) PCT Pub. No.: WO2018/060961
PCT Pub. Date: Apr. 5, 2018

(65) Prior Publication Data
US 2019/0245650 A1    Aug. 8, 2019

Related U.S. Application Data

(60) Provisional application No. 62/402,840, filed on Sep. 30, 2016.

(51) Int. Cl.
*H04L 1/00* (2006.01)
*H03M 13/29* (2006.01)
(Continued)

(52) U.S. Cl.
CPC .......... *H04L 1/0041* (2013.01); *H03M 13/13* (2013.01); *H03M 13/23* (2013.01);
(Continued)

(58) Field of Classification Search
CPC ............... H03M 13/13; H03M 13/616; H03M 13/1102; H03M 13/1174; H03M 13/2933;
(Continued)

(56) References Cited

U.S. PATENT DOCUMENTS

2010/0169748 A1*  7/2010  Zhao ..................... H04L 1/0071
                                                          714/790
2014/0208183 A1*  7/2014  Mahdavifar ........ H03M 13/296
                                                          714/755

(Continued)

OTHER PUBLICATIONS

Usman, Concatenated Convolution-Polar codes over Rayleigh Channels degraded as Erasure channels, Jan. 7-8, 2016, 10th International Conference in Intelligent Systems and Control (ISCO) (Year: 2016).*

(Continued)

*Primary Examiner* — April Y Blair
*Assistant Examiner* — Sazzad Hossain
(74) *Attorney, Agent, or Firm* — Christopher & Weisberg, P.A.

(57) ABSTRACT

A method in a node (110, 115) comprises generating (604) a plurality of constituent polar codes, each of the plurality of constituent polar codes having an associated block length and an associated set of information bits. The method comprises coupling (608) at least a portion of the sets of information bits associated with each of the plurality of constituent polar codes to generate a spatially coupled polar code. The method comprises encoding (612) a wireless transmission using the spatially coupled polar code.

22 Claims, 12 Drawing Sheets

(51) Int. Cl.
  *H03M 13/13* (2006.01)
  *H03M 13/23* (2006.01)
  H03M 13/00 (2006.01)
  H03M 13/11 (2006.01)

(52) U.S. Cl.
  CPC ...... *H03M 13/2933* (2013.01); *H04L 1/0057* (2013.01); *H04L 1/0066* (2013.01); *H03M 13/1102* (2013.01); *H03M 13/1174* (2013.01); *H03M 13/616* (2013.01); *H03M 13/6375* (2013.01); *H04L 1/0013* (2013.01); *H04L 1/0054* (2013.01); *H04L 1/0068* (2013.01)

(58) Field of Classification Search
  CPC . H03M 13/6375; H03M 13/23; H04L 1/0041; H04L 1/0068; H04L 1/0013; H04L 1/0054; H04L 1/0057; H04L 1/0066
  See application file for complete search history.

(56) References Cited

U.S. PATENT DOCUMENTS

| | | | |
|---|---|---|---|
| 2015/0295593 A1 | 10/2015 | Trifonov et al. | |
| 2016/0182187 A1* | 6/2016 | Kim | H04L 1/1861 714/807 |
| 2016/0285479 A1* | 9/2016 | El-Khamy | H03M 13/616 |
| 2016/0373586 A1* | 12/2016 | Lim | H04M 7/1295 |
| 2017/0222757 A1* | 8/2017 | Huang | H03M 13/13 |
| 2017/0244429 A1* | 8/2017 | Hof | H03M 13/134 |
| 2018/0375615 A1* | 12/2018 | Xu | H04L 1/0068 |

OTHER PUBLICATIONS

Capacity-Achieving Rate-Compatible Polar Codes by Song-Nam Hong et al.; 2016 IEEE International Symposium on Information Theory—2016.

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.

List Decoding of Polar Codes by Ido Tai; IEEE Transactions on Information Theory, vol. 61, No. 5—May 2015.

A New Multiple Folded Successive Cancellation Decoder for Polar Codes by Harish Vangala et al.,—IEEE 2014.

Parallel Concatenated Systematic Polar Codes by Dongsheng Wu et al.; Electronics Letters, vol. 52, No. 1, pp. 43-45—Jan. 8, 2016.

3GPP TSG RAN WG1 Meeting #86; Gothenburg, Sweden; Source: Huawei, HiSilicon; Title: Channel coding for control channels (R1-167216)—Aug. 22-26, 2016.

PCT Notification of Transmittal of the International Search Report and the Written Opinion of the Internatinoal Searching Authority, or the Declaration for International application No. PCT/IB2017/056033—dated Mar. 12, 2018.

* cited by examiner

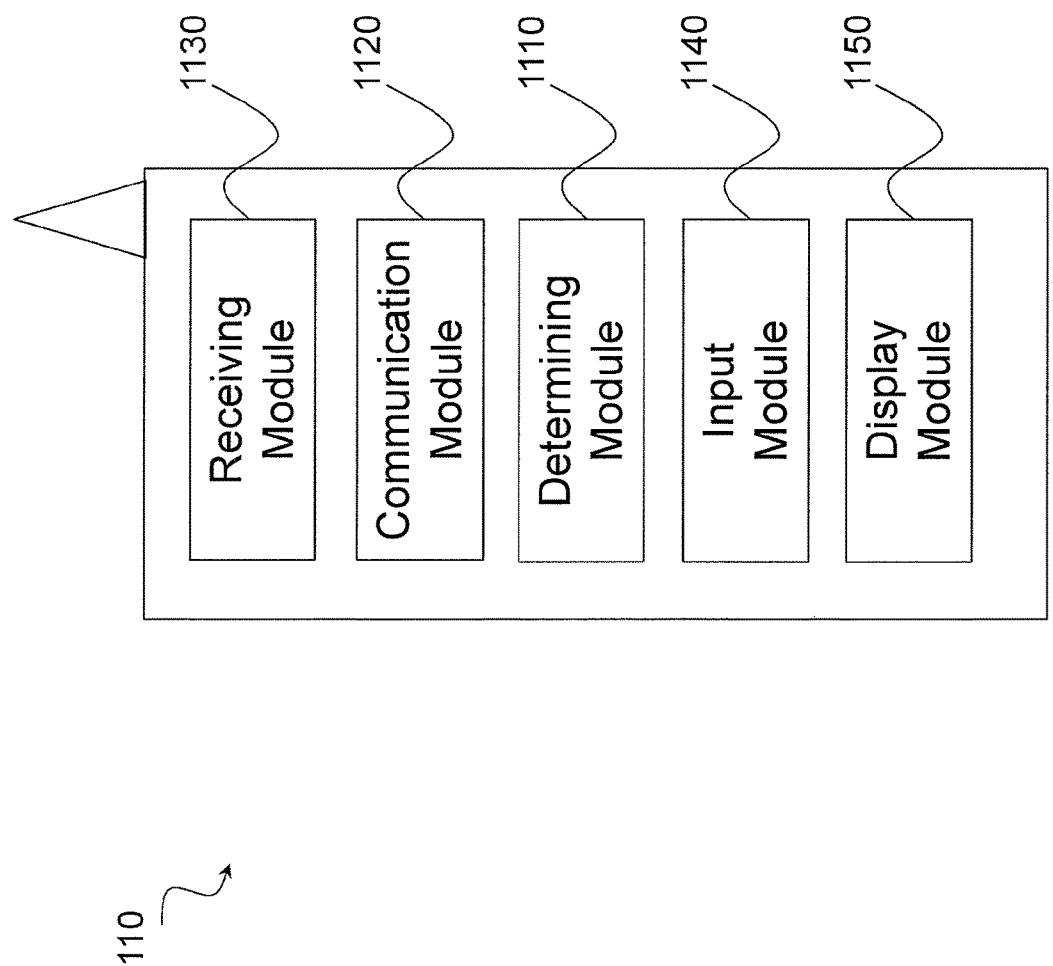

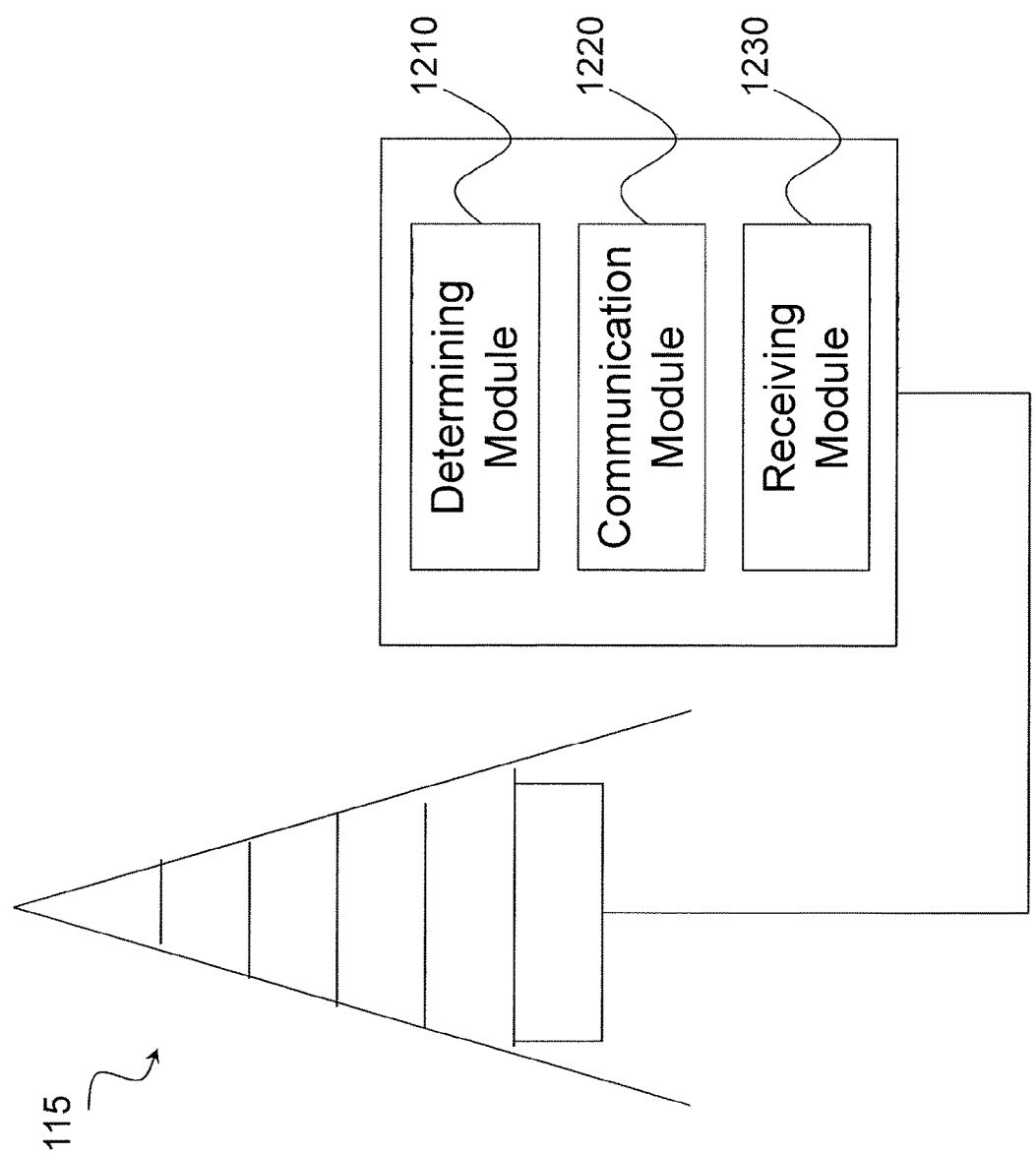

SPATIALLY COUPLED POLAR CODES

PRIORITY

This nonprovisional application is a U.S. National Stage Filing under 35 U.S.C. § 371 of International Patent Application Serial No. PCT/IB2017/056033 filed Sep. 29, 2017 and entitled "SPATIALLY COUPLED POLAR CODES" which claims priority to U.S. Provisional Patent Application No. 62/402,840 filed Sep. 30, 2016 both of which are hereby incorporated by reference in their entirety.

TECHNICAL FIELD

The present disclosure relates, in general, to wireless communications and, more particularly, to spatially coupled polar codes.

BACKGROUND

Polar codes, proposed by E. Arikan in "Channel Polarization: A Method for Constructing Capacity-Achieving Codes for Symmetric Binary-Input Memoryless Channels," IEEE Transactions on Information Theory, vol. 55, pp. 3051-3073, July 2009 (hereinafter "Arikan"), are the first class of constructive coding schemes that are provable to achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. Later, a SC list (SCL) decoder was proposed by I. Tal and A. Vardy in "List Decoding of Polar Codes," Proceedings of IEEE Symp. Inf. Theory, pp. 1-5, 2011 (hereinafter, "Tal"), which can approach the performance of the optimal maximum-likelihood (ML) decoder. By concatenating a simple Cyclic Redundancy Check (CRC) coding, it was shown that the performance of concatenated polar codes is competitive with that of well-optimized LDPC and Turbo codes. As a result, polar codes are being considered as a candidate for future wireless communication systems, such as 5G.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free), while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code.

FIG. 1 illustrates an example of polar code structure in a first transmission in HARQ incremental redundancy. More particularly, FIG. 1 illustrates the structure of a length-8 polar code. In the first transmission illustrated in FIG. 1, six out of eight bit channels of the length-8 polar code are loaded with data (non-frozen or information bits $u_0$ through $u_5$) while the rest are frozen (assigned a value of zero, which is known to the receiver), giving an overall code rate of 3/4.

As shown in Arikan, the complexity of a SC decoder grows as $O(N \log N)$ where N denotes the coded block length. An SCL decoder can be viewed as a generalization of the SC decoder, where multiple, say L (with L>1), SC decoders are running concurrently in parallel to maintain L surviving paths (instead of maintaining just one path as done by a SC decoder) after each bit decision is made. As shown in Tal, the complexity of a SCL decoder grows as $O(LN \log N)$.

One of the main issues that hinder practical applications of polar codes is inflexibility in block length selection, as the length of each code block must be a power of 2. In many practical wireless systems, there is often a need to support a large number of different block lengths. In order to support block lengths that are not powers of 2, some of the coded bits produced by a polar encoder are often punctured away (i.e., dropped and not transmitted). Since the sequence of powers of two grows exponentially, two adjacent powers of 2 can be quite far apart. As a result, a relatively large number of coded bits may have to be punctured, unless only short block lengths are desired. Such a heavy puncturing often leads to significant performance degradation.

An existing approach of providing finer granularity in the block lengths of polar codes is to use a code of small block length multiple times. Although the performance of polar codes with small block lengths are often quite competitive with the best-known codes of similar lengths, this approach has certain deficiencies. For example, such an approach limits the overall minimum distance of the overall code, which will lead to undesirable block error performance. Thus, other methods of improving the block length granularity in polar codes are highly desirable.

SUMMARY

To address the foregoing problems with existing approaches, disclosed is a method in a node. The method comprises generating a plurality of constituent polar codes, each of the plurality of constituent polar codes having an associated block length and an associated set of information bits. The method comprises coupling at least a portion of the sets of information bits associated with each of the plurality of constituent polar codes to generate a spatially coupled polar code. The method comprises encoding a wireless transmission using the spatially coupled polar code.

In certain embodiments, coupling at least a portion of the sets of information bits associated with each of the plurality of constituent polar codes to generate a spatially coupled polar code may comprise using a first subset of information bits in a first set of information bits associated with a first constituent polar code to form one or more information bits of another set of information bits associated with another constituent polar code of the plurality of constituent polar codes.

In certain embodiments, the at least a portion of the sets of information bits associated with each of the plurality of constituent polar codes may be coupled using a coupling matrix that specifies how information bits from a first constituent polar code of the plurality of constituent polar codes are coupled to one or more other constituent polar codes of the plurality of constituent polar codes. The coupling matrix may comprise elements from a binary Galois field. The coupling matrix may be expressed as a block-wise upper triangular form.

In certain embodiments, a block length of the spatially coupled polar code may be equal to the sum of the block length of each of the plurality of constituent polar codes.

In certain embodiments, encoding a wireless transmission using the spatially coupled polar code may comprise determining, for each of a plurality of polar encoders, an associated set of coupled information bits, and running each of the plurality of polar encoders by, for each of the plurality of polar encoders, putting the associated set of coupled information bits into information bit locations based on an interleaving function and freezing a plurality of other bit locations to zero. In certain embodiments, the method may comprise puncturing a plurality of bits of an individual polar encoder of the plurality of polar encoders such that an output of the individual polar encoder has a length other than a power of 2. In certain embodiments, the method may comprise refraining from puncturing bits for individual polar encoders of the plurality of polar encoders such that an output of the individual polar encoder has a length that is a power of 2.

In certain embodiments, each of the plurality of constituent polar codes may have the same size, the coupling matrix may be a banded Toeplitz matrix, and the spatially coupled polar code may be a concatenated convolutional-polar code.

In certain embodiments, a first subset of information bits in a first set of information bits associated with a first constituent polar code may be identical to another subset of information bits in another set of information bits associated with another constituent polar code. A plurality of information bits having high reliability in the first set of information bits associated with the first constituent polar code may be coupled with other information bits having low reliability in the other set of information bits associated with the other constituent polar code. The spatially coupled polar code may comprise a parallel concatenated polar code.

In certain embodiments, the method may comprise transmitting the wireless transmission encoded using the spatially coupled polar code.

According to another example embodiment, a node is disclosed. The node comprises processing circuitry. The processing circuitry is configured to generate a plurality of constituent polar codes, each of the plurality of constituent polar codes having an associated block length and an associated set of information bits. The processing circuitry is configured to couple at least a portion of the sets of information bits associated with each of the plurality of constituent polar codes to generate a spatially coupled polar code. The processing circuitry is configured to encode a wireless transmission using the spatially coupled polar code.

According to another example embodiment, a method in a node is disclosed. The method comprises receiving a wireless transmission encoded using a spatially coupled polar code, the spatially coupled polar code comprising a plurality of sets of information bits at least a portion of which have been coupled, each set of information bits associated with one of a plurality of constituent polar codes. The method comprises decoding the wireless transmission encoded using the spatially coupled polar code using feedforward decoding.

In certain embodiments, a block length of the spatially coupled polar code may be equal to the sum of the block length of each of the plurality of constituent polar codes. In certain embodiments, the spatially coupled polar code may be a concatenated convolutional-polar code. In certain embodiments, the spatially coupled polar code may be a parallel concatenated polar code.

In certain embodiments, decoding the wireless transmission encoded using the spatially coupled polar code using feedforward decoding may comprise: decoding a plurality of coupled information bit vectors; decoding a decoding the plurality of coupled information bit vectors may comprise: running a plurality of polar decoders in series, the plurality of polar decoders comprising a first polar first information bit; and decoding one or more remaining information bits sequentially. In certain embodiments, decoding the plurality of coupled information bit vectors may comprise running each of a plurality of polar decoders in parallel, wherein each of the plurality of polar decoders is associated with one of the plurality of constituent polar codes. In certain embodiments decoder, wherein each of the plurality of polar decoders is associated with one of the plurality of constituent polar codes; generating, by the first polar decoder, one or more of soft output information and hard output information; and providing, from the first polar decoder to at least one subsequent polar decoder in a series of the plurality of polar decoders, one or more of the soft output information and hard output information generated by the first polar decoder. In certain embodiments, the soft output information may comprise a log likelihood ratio.

According to another example embodiment, a node is disclosed. The node comprises processing circuitry. The processing circuitry is configured to receive a wireless transmission encoded using a spatially coupled polar code, the spatially coupled polar code comprising a plurality of sets of information bits at least a portion of which have been coupled, each set of information bits associated with one of a plurality of constituent polar codes. The processing circuitry is configured to decode the wireless transmission encoded using the spatially coupled polar code using feedforward decoding.

Certain embodiments of the present disclosure may provide one or more technical advantages. For example, certain embodiments may advantageously enable code block lengths other than powers of 2 without performance degradation. As another example, certain embodiments may enable feedforward decoding to be used to achieve capacity. As another example, by coupling multiple constituent polar codes, the minimum distance of the code, which affects the block error performance at high signal-to-noise ratio (SNR) region, can be advantageously improved beyond each individual polar code. Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which:

FIG. 11 is a block schematic of an exemplary wireless device, in accordance with certain embodiments; and FIG. 12 is a block schematic of an exemplary network node, in accordance with certain embodiments.

DETAILED DESCRIPTION

Figure 1:
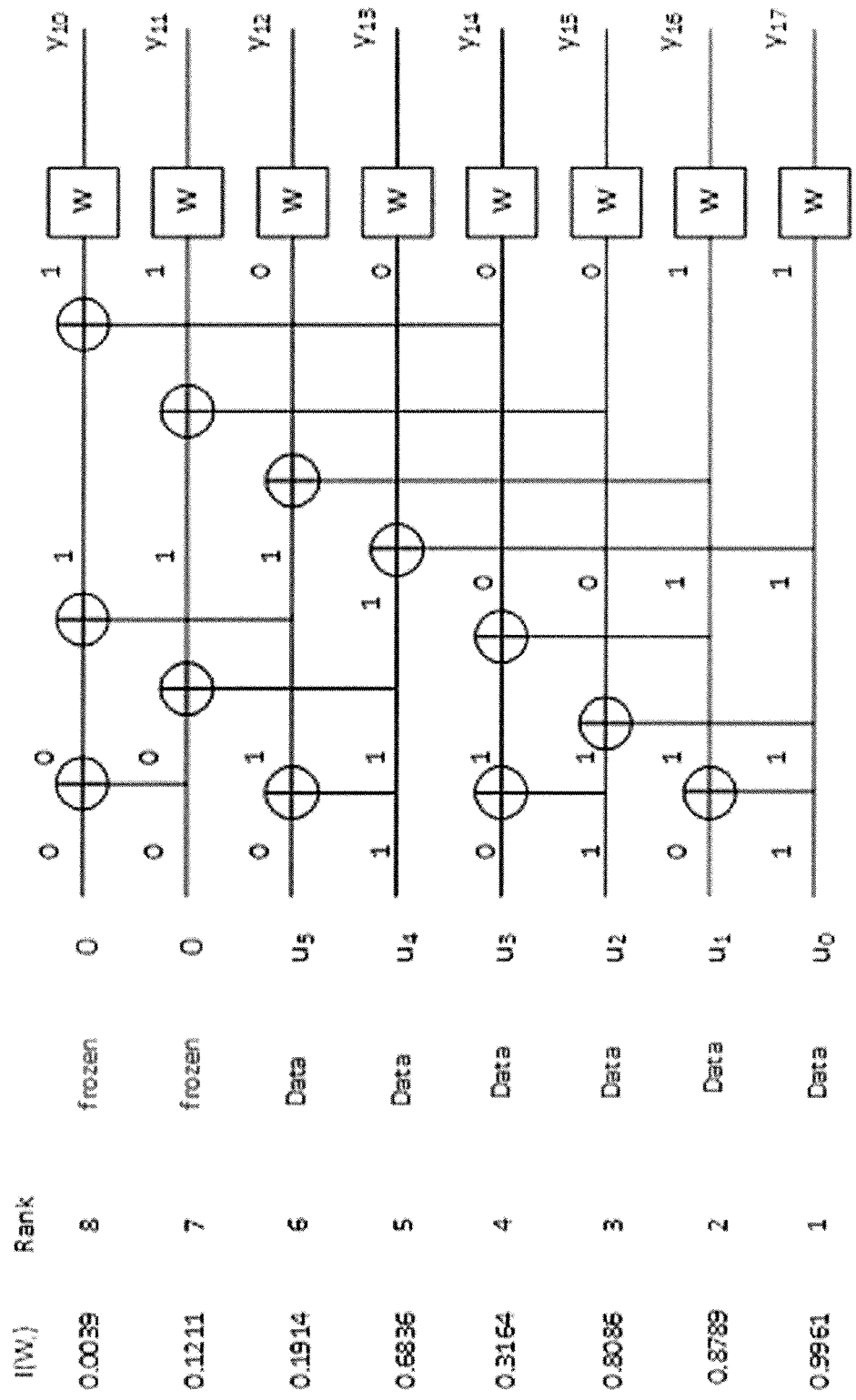
FIG. 1 illustrates an example of polar code structure in a first transmission in HARQ incremental redundancy.

As discussed above, there are issues that hinder practical applications of polar codes. One such issue is the inflexibility in block length selection, as the length of each code block must be a power of 2. In many practical wireless systems, there is often a need to support a large number of different block lengths. One approach to support block lengths that are not powers of 2 is to puncture some of the coded bits produced by a polar encoder. Since the sequence of powers of 2 grows exponentially, two adjacent powers of 2 can be quite far apart. As a result, a relatively large number of coded bits may have to be punctured. This heavy puncturing often leads to significant performance degradation.

As described above, one existing approach of providing finer granularity in the block lengths of polar codes is to use a code of small block length multiple times. Although the performance of polar codes with small block lengths are often quite competitive with the best known codes of similar lengths, this approach also has certain disadvantages. For example, such an approach limits the overall minimum distance of the overall code, which will lead to undesirable block error performance. Thus, other methods of improving the block length granularity in polar codes are highly desirable.

The present disclosure contemplates various embodiments that may address these and other deficiencies. In certain embodiments, this is achieved by "spatially" coupling multiple constituent polar codes (possibly with different block lengths) together so that the block length of the overall code is the sum of the block lengths of the individual constituent codes. A large number of different block lengths can be supported by choosing different combinations of constituent block lengths. As described in more detail below, the information bits of one or more polar codes may be mixed/coupled in order to form some of the information bits of another polar code(s). This mixing or coupling step may advantageously extend the minimum distance of the overall code beyond that of each constituent polar code. In certain embodiments, the output of each of these constituent polar codes may also be punctured to achieve even higher flexibility in block length selection.

These spatially coupled polar codes are suitable for use with a decision feedforward decoding algorithm (though other methods of decoding, such as ML decoding and stack decoding, are also possible), where the decoded information bits from one or more constituent polar codes may be used to make an inference on the information bits of the next constituent polar code, thus reducing its effective coding rate of that constituent code. It can be shown that so long as the minimum block length of the constituent codes tends to infinity as the overall block length tends to infinity, the resulting performance of such spatially coupled polar code using the decision feedforward decoding approaches capacity as the overall block length approaches the capacity.

According to one example embodiment, a method in a node is disclosed. The node may be any suitable network entity. For example, in certain embodiments the node may be a network node. As another example, in certain embodiments the node may be a wireless device (e.g., a UE). The node generates a plurality of constituent polar codes, each of the plurality of constituent polar codes having an associated block length and an associated set of information bits. The node couples at least a portion of the sets of information bits associated with each of the plurality of constituent polar codes to generate a spatially coupled polar code. In some cases, the node may couple the at least a portion of the sets of information bits associated with each of the plurality of constituent polar codes to generate the spatially coupled polar code by using a first subset of information bits in a first set of information bits associated with a first constituent polar code to form one or more information bits of another set of information bits associated with another constituent polar code of the plurality of constituent polar codes.

The node encodes a wireless transmission using the spatially coupled polar code. In some cases, the node may encode the wireless transmission using the spatially coupled polar code by determining, for each of a plurality of polar encoders, an associated set of coupled information bits, and running each of the plurality of polar encoders by, for each of the plurality of polar encoders, putting the associated set of coupled information bits into information bit locations based on an interleaving function and freezing a plurality of other bit locations to zero. In certain embodiments, the node transmits the wireless transmission encoded using the spatially coupled polar code (for example, to another node).

According to another example embodiment, a method in a node is disclosed. The node may be any suitable network entity. For example, in certain embodiments the node may be a network node. As another example, in certain embodiments the node may be a wireless device (e.g., a UE). The node receives a wireless transmission encoded using a spatially coupled polar code, the spatially coupled polar code comprising a plurality of sets of information bits at least a portion of which have been coupled, each set of information bits associated with one of a plurality of constituent polar codes. The node decodes the wireless transmission encoded using the spatially coupled polar code using feedforward decoding.

In some cases, the node decodes the wireless transmission encoded using the spatially coupled polar code using feedforward decoding by decoding a plurality of coupled information bit vectors, decoding a first information bit, and decoding one or more remaining information bits sequentially. In some cases, the node may decode the plurality of coupled information bit vectors by running each of a plurality of polar decoders in parallel, wherein each of the plurality of polar decoders is associated with one of the plurality of constituent polar codes. In some cases, the node may decode the plurality of coupled information bit vectors by: running a plurality of polar decoders in series, the plurality of polar decoders comprising a first polar decoder, wherein each of the plurality of polar decoders is associated with one of the plurality of constituent polar codes; generating, by the first polar decoder, one or more of soft output information and hard output information; and providing, from the first polar decoder to at least one subsequent polar decoder in a series of the plurality of polar decoders, one or more of the soft output information and hard output information generated by the first polar decoder.

Certain embodiments of the present disclosure may provide one or more technical advantages. For example, certain embodiments may advantageously enable code block lengths other than powers of 2 without performance degradation. As another example, certain embodiments may enable feedforward decoding to be used to achieve capacity. As another example, by coupling multiple constituent polar codes, the minimum distance of the code, which affects the block error performance at high SNR region, can be advantageously improved beyond each individual polar code. Other advantages may be readily apparent to one having skill in the art. Certain embodiments may have none, some, or all of the recited advantages.

Figure 2:
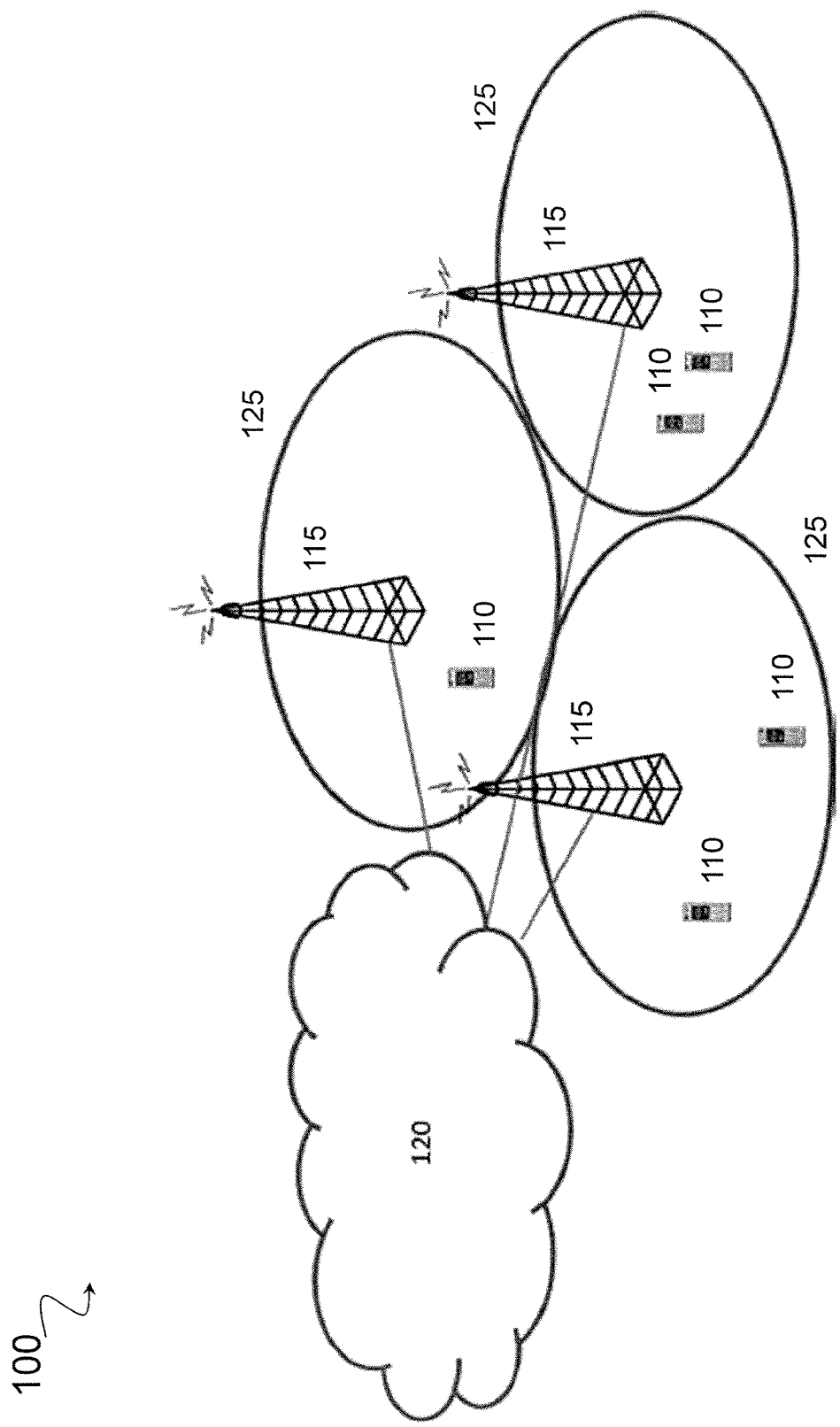
FIG. 2 is a block diagram illustrating an embodiment of a network, in accordance with certain embodiments.

FIG. 2 is a block diagram illustrating an embodiment of a network 100, in accordance with certain embodiments. Network 100 includes one or more wireless devices 110 and one or more network nodes 115. Wireless devices 110 may communicate with network nodes 115 over a wireless interface. For example, wireless device 110 may transmit wireless signals to one or more of network nodes 115, and/or receive wireless signals from one or more of network nodes 115. The wireless signals may contain voice traffic, data traffic, control signals, and/or any other suitable information. In some embodiments, an area of wireless signal coverage associated with a network node 115 may be referred to as a cell 125. In some embodiments, wireless device 110 may have device-to-device (D2D) capability. Thus, wireless devices 110 may be able to receive signals from and/or transmit signals directly to another wireless device.

In certain embodiments, network nodes 115 may interface with a radio network controller. The radio network controller may control network nodes 115 and may provide certain radio resource management functions, mobility management functions, and/or other suitable functions. In certain embodiments, the functions of the radio network controller may be included in network node 115. The radio network controller may interface with a core network node. In certain embodiments, the radio network controller may interface with the core network node via an interconnecting network 120. Interconnecting network 120 may refer to any interconnecting system capable of transmitting audio, video, signals, data, messages, or any combination of the preceding. Interconnecting network 120 may include all or a portion of one or more Internet Protocol (IP) networks, public switched telephone networks (PSTNs), packet data networks, optical networks, public or private data networks, local area networks (LANs), wireless local area networks (WLANs), wired networks, wireless networks, metropolitan area networks (MANs), wide area networks (WAN), a local, regional, or global communication or computer network such as the Internet, an enterprise intranet, or any other suitable communication links, including combinations thereof, to enable communication between devices.

In some embodiments, the core network node may manage the establishment of communication sessions and various other functionalities for wireless devices 110. Wireless devices 110 may exchange certain signals with the core network node using the non-access stratum layer. In non-access stratum signaling, signals between wireless devices 110 and the core network node may be transparently passed through the radio access network (RAN). In certain embodiments, network nodes 115 may interface with one or more network nodes over an internode interface, such as, for example, an X2 interface.

As described above, example embodiments of network 100 may include one or more wireless devices 110, and one or more different types of network nodes 115 capable of communicating (directly or indirectly) with wireless devices 110.

In some embodiments, the non-limiting term wireless device is used. Wireless devices 110 described herein can be any type of wireless device capable, configured, arranged and/or operable to communicate wirelessly with network nodes 115 and/or another wireless device, for example over radio signals. Communicating wirelessly may involve transmitting and/or receiving wireless signals using electromagnetic signals, radio waves, infrared signals, and/or other types of signals suitable for conveying information through air. In particular embodiments, wireless devices may be configured to transmit and/or receive information without direct human interaction. For instance, a wireless device may be designed to transmit information to a network on a predetermined schedule, when triggered by an internal or external event, or in response to requests from the network. Generally, a wireless device may represent any device capable of, configured for, arranged for, and/or operable for wireless communication, for example radio communication devices. Examples of wireless devices include, but are not limited to, user equipment (UEs) such as smart phones. Further examples include wireless cameras, wireless-enabled tablet computers, laptop-embedded equipment (LEE), laptop-mounted equipment (LME), USB dongles, and/or wireless customer-premises equipment (CPE). Wireless device 110 may also be a radio communication device, target device, D2D UE, machine-type-communication (MTC) UE or UE capable of machine-to-machine (M2M) communication, low-cost and/or low-complexity UE, a sensor equipped with UE, Tablet, mobile terminals, an Internet of Things (IoT) device, or a Narrowband IoT (NB-JOT) device, or any other suitable devices.

As one specific example, wireless device 110 may represent a UE configured for communication in accordance with one or more communication standards promulgated by the $3^{rd}$ Generation Partnership Project (3GPP), such as 3GPP's Global System for New Radio (NR), Mobile Communications (GSM), Universal Mobile Telecommunications System (UMTS), Long Term Evolution (LTE), and/or other suitable 2G, 3G, 4G or 5G standards or other suitable standards. As used herein, a "UE" may not necessarily have a "user" in the sense of a human user who owns and/or operates the relevant device. Instead, a UE may represent a device that is intended for sale to, or operation by, a human user but that may not initially be associated with a specific human user.

Wireless device 110 may support D2D communication, for example by implementing a 3GPP standard for sidelink communication, and may in this case be referred to as a D2D communication device.

As yet another specific example, in an IoT scenario, a wireless device may represent a machine or other device that performs monitoring and/or measurements, and transmits the results of such monitoring and/or measurements to another wireless device and/or a network node. The wireless device may in this case be a M2M device, which may in a 3GPP context be referred to as a MTC device. As one particular example, the wireless device may be a UE implementing the 3GPP NB-IoT standard. Particular examples of such machines or devices are sensors, metering devices such as power meters, industrial machinery, or home or personal appliances (e.g., refrigerators, televisions, personal wearables such as watches, etc.). In other scenarios, a wireless device may represent a vehicle or other equipment that is capable of monitoring and/or reporting on its operational status or other functions associated with its operation.

Wireless device 110 as described above may represent the endpoint of a wireless connection, in which case the device may be referred to as a wireless terminal. Furthermore, a wireless device as described above may be mobile, in which case it may also be referred to as a mobile device or a mobile terminal.

As depicted in FIG. 1, wireless device 110 may be any type of wireless endpoint, mobile station, mobile phone, wireless local loop phone, smartphone, user equipment, desktop computer, Personal Digital Assistant (PDA), cell phone, tablet, laptop, Voice Over IP (VoIP) phone or handset, which is able to wirelessly send and receive data and/or signals to and from a network node, such as network node 115 and/or other wireless devices.

Wireless device 110 (e.g., an end station, a network device) may store and transmit (internally and/or with other electronic devices over a network) code (composed of software instructions) and data using machine-readable media, such as non-transitory machine-readable media (e.g., machine-readable storage media such as magnetic disks; optical disks; read-only memory (ROM); flash memory devices; phase change memory) and transitory machine-readable transmission media (e.g., electrical, optical, acoustical or other form of propagated signals—such as carrier waves, infrared signals). In addition, wireless devices 110 may include hardware such as a set of one or more processors coupled to one or more other components, such as one or more non-transitory machine-readable media (to store code and/or data), user input/output devices (e.g., a keyboard, a touchscreen, and/or a display), and network connections (to transmit code and/or data using propagating signals). The coupling of the set of processors and other components is typically through one or more busses and bridges (also termed as bus controllers). Thus, a non-transitory machine-readable medium of a given electronic device typically stores instructions for execution on one or more processors of that electronic device. One or more parts of an embodiment described herein may be implemented using different combinations of software, firmware, and/or hardware.

Also, in some embodiments generic terminology, "network node" is used. As used herein, "network node" refers to equipment capable, configured, arranged and/or operable to communicate directly or indirectly with a wireless device and/or with other equipment (e.g., another network node) in the wireless communication network that enable and/or provide wireless access to the wireless device. Examples of network nodes include, but are not limited to, access points (APs), in particular radio access points. A network node may represent base stations (BSs), such as radio base stations. Particular examples of radio base stations include Node Bs, evolved Node Bs (eNBs), Master eNB (MeNB), Secondary eNB (SeNB), and gNBs. Base stations may be categorized based on the amount of coverage they provide (or, stated differently, their transmit power level) and may then also be referred to as femto base stations, pico base stations, micro base stations, or macro base stations. "Network node" also includes one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base stations may also be referred to as nodes in a distributed antenna system (DAS).

As a particular non-limiting example, a base station may be a relay node or a relay donor node controlling a relay.

Yet further examples of network nodes include a network node belonging to a Master Cell Group (MCG), a network node belonging to a Secondary Cell Group (SCG), multi-standard radio (MSR) radio equipment such as MSR BSs, network controllers such as radio network controllers (RNCs) or base station controllers (BSCs), base transceiver stations (BTSs), transmission points, transmission nodes, Multi-cell/multicast Coordination Entities (MCEs), core network nodes (e.g., Mobile Switching Centers (MSCs), Mobility Management Entities (MMEs), etc.), Operation and Maintenance (O&M) nodes, Operations Support System (OSS) nodes, Self-Organizing Network (SON) nodes, positioning nodes (e.g., Evolved Serving Mobile Location Center (E-SMLCs)), minimization of drive tests (MDTs), or any other suitable network node. More generally, however, network nodes may represent any suitable device (or group of devices) capable, configured, arranged, and/or operable to enable and/or provide a wireless device access to the wireless communication network or to provide some service to a wireless device that has accessed the wireless communication network.

Network nodes 115 may be a piece of networking equipment, including hardware and software, which communicatively interconnects other equipment on the network (e.g., wireless devices 110, other network devices, end stations). Some network devices are "multiple services network devices" that provide support for multiple networking functions (e.g., routing, bridging, switching, Layer 2 aggregation, session border control, Quality of Service, and/or subscriber management), and/or provide support for multiple application services (e.g., data, voice, and video). Subscriber end stations (e.g., servers, workstations, laptops, netbooks, palm tops, mobile phones, smartphones, multimedia phones, VOIP phones, user equipment, terminals, portable media players, GPS units, gaming systems, set-top boxes) access content/services provided over the Internet and/or content/services provided on virtual private networks (VPNs) overlaid on (e.g., tunneled through) the Internet. The content and/or services are typically provided by one or more end stations (e.g., server end stations) belonging to a service or content provider or end stations participating in a peer to peer service, and may include, for example, public webpages (e.g., free content, store fronts, search services), private webpages (e.g., username/password accessed webpages providing email services), and/or corporate networks over VPNs. Typically, subscriber end stations are coupled (e.g., through CPE coupled to an access network (wired or wirelessly)) to edge network devices, which are coupled (e.g., through one or more core network devices) to other edge network devices, which are coupled to other end stations (e.g., server end stations). One of ordinary skill in the art would realize that any network device, end station or other network apparatus can perform various functions described herein.

The term "node" may be used herein generically to refer both to wireless devices and network nodes, as each is respectively described above.

The terminology such as network node and wireless device should be considered non-limiting and does in particular not imply a certain hierarchical relation between the two; in general "network node" could be considered as a first device and "wireless device" as a second device, and these two devices communicate with each other over some radio channel.

Example embodiments of wireless devices 110, network nodes 115, and other network nodes (such as radio network controller or core network node) are described in more detail below with respect to FIGS. 8-12.

Although FIG. 2 illustrates a particular arrangement of network 100, the present disclosure contemplates that the various embodiments described herein may be applied to a variety of networks having any suitable configuration. For example, network 100 may include any suitable number of wireless devices 110 and network nodes 115, as well as any additional elements suitable to support communication between wireless devices or between a wireless device and another communication device (such as a landline telephone). In different embodiments, the wireless network 100 may comprise any number of wired or wireless networks, network nodes, base stations, controllers, wireless devices, relay stations, and/or any other components that may facilitate or participate in the communication of data and/or signals whether via wired or wireless connections.

Furthermore, the embodiments described herein may be implemented in any appropriate type of telecommunication system using any suitable components, and are applicable to any radio access technology (RAT) or multi-RAT systems in which a wireless device receives and/or transmits signals (e.g., data). For example, the various embodiments described herein may be applicable to NR, LTE, LTE-Advanced, 5G, UMTS, HSPA, GSM, cdma2000, WCDMA, WiMax, UMB, WiFi, another suitable RAT, or any suitable combination of one or more RATs. Thus, network 100 may represent any type of communication, telecommunication, data, cellular, and/or radio network or other type of system. In particular embodiments, the network 100 may be configured to operate according to specific standards or other types of predefined rules or procedures. Thus, particular embodiments of the wireless communication network may implement communication standards, such as NR, GSM, UMTS, LTE, and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, and/or ZigBee standards.

Although certain embodiments may be described in the context of wireless transmissions in the downlink (DL), the present disclosure contemplates that the various embodiments are equally applicable in the uplink (UL).

As described above, in certain embodiments a node (e.g., wireless device 110 or network node 115) generates a plurality of constituent polar codes, each of the plurality of constituent polar codes having an associated block length and an associated set of information bits. The node couples at least a portion of the sets of information bits associated with each of the plurality of constituent polar codes to generate a spatially coupled polar code. The construction of the spatially coupled polar code is described in detail below.

Let $C_i(N_i, A_i)$ denote a (constituent) polar code with block length $N_i$ and information bit location set $A_i$, for $i=1, 2, \ldots, S$, where S denotes the number of constituent polar codes. Let $q_i:\{1,2,\ldots,|A_i|\} \to A_i$ be an interleaving function, or index mapping function, used to load the information bit values into the corresponding information bit locations of $C_i(N_i, A_i)$. For notational simplicity, let $K_i = |A_i|$ where $|A|$ denotes the size of the set A, and let $[N] \equiv \{1,2,\ldots,N\}$.

An example way of coupling the information bits of these S constituent Polar codes is described herein. Let $E_{i,j}$, for $i \neq j$, denote a $K_i \times K_j$ coupling matrix, whose elements are from the binary Galois field $\mathbb{F}_2$, used to specify how the information bits from $C_i(N_i,A_i)$ and from $C_j(N_j,A_j)$ are coupled or related. Specifically, let $b_i = b_{i,2}, \ldots, b_{i,|A_i|})$ denote the vector of information bits for $C_i(N_i,A_i)$, then the different information bit vectors are related through the coupling matrices $\{E_{i,j}\}$ by:

$$b_i = \Sigma_{j=1} b_j E_{j,i} \tag{1}$$

for each $i \in \{1, 2, \ldots, S\}$. Equation (1) can be expressed compactly in matrix form as:

$$bE = 0 \tag{2}$$

where $b \triangleq (b_1, b_2, \ldots, b_S)$ and $$E \triangleq \begin{bmatrix} -1 & E_{1,2} & \cdots & E_{1,S} \\ E_{2,1} & -1 & \ddots & \vdots \\ \vdots & \ddots & \ddots & E_{S-1,S} \\ E_{S,1} & \cdots & E_{S,S-1} & -1 \end{bmatrix}.$$

This set of S Polar codes whose information bits $\{b_i\}$ are cross coupled in this manner is referred to as a "spatially coupled polar code." Coupling multiple polar codes in this manner enhances the minimum distance property of the overall code beyond each individual polar code, while allowing low-complexity encoding and decoding whose complexity increases only linearly with the number of constituent polar codes and thus the overall block length.

From Equation (2) above, it can be seen that the amount of independent information bits that can be specified into this set of S coupled polar codes can be characterized by the left null space of E (i.e., the space that is orthogonal to the column space of E). Let F be a $k \times \Sigma_{i=1}^{S} K_i$ matrix whose rows are a set of k basis vectors of that null space so that FE=0. It follows that the input of the S polar codes must be in the span of F, i.e., $$b = uF$$

where $u \in \mathbb{F}_2^k$ denotes a vector of independent information bits that serves as the input of the overall spatially coupled polar code. For any set $\{k_i\}_{i \in \{1,2,\ldots,S\}}$ of integers such that $$k = \Sigma_{i=1}^{S} k_i \text{ and } k_i \leq K_i \text{ for all } i,$$

it can be shown by block-wise Gaussian elimination that there exist coupling matrices such that the matrix F can be expressed as a block-wise upper triangular form, i.e., $$F \triangleq \begin{bmatrix} F_{1,1} & F_{2,1} & \cdots & F_{S,1} \\ 0 & F_{2,2} & \ddots & \vdots \\ \vdots & \ddots & \ddots & F_{S,S-1} \\ 0 & \cdots & 0 & F_{S,S} \end{bmatrix}. \tag{3}$$

where $F_{i,j}$ is a $k_i \times K_j$ submatrix.

As described above, in certain embodiments the node (e.g., wireless device 110 or network node 115) encodes a wireless transmission using the spatially coupled polar code. The encoding of the wireless transmission using the spatially coupled polar code is described in more detail below.

In certain embodiments, by partitioning the information bit vector u accordingly as $u = (u_1, u_2, \ldots, u_S)$, the encoding of a spatially coupled polar code can be carried out in two steps. First, the node computes the coupled information bits for each polar encoder recursively as:

$$b_i = \Sigma_{j=1}^{i} u_j F_{i,j} \tag{4}$$

from i=1 to i=S based upon the coupling matrix F. Second, the node runs each polar encoder by putting the coupled information bits $b_i$ based on the interleaving function $q_i(\bullet)$ into the information bit locations $A_i$, while freezing other bit locations to zeros.

Figure 3:
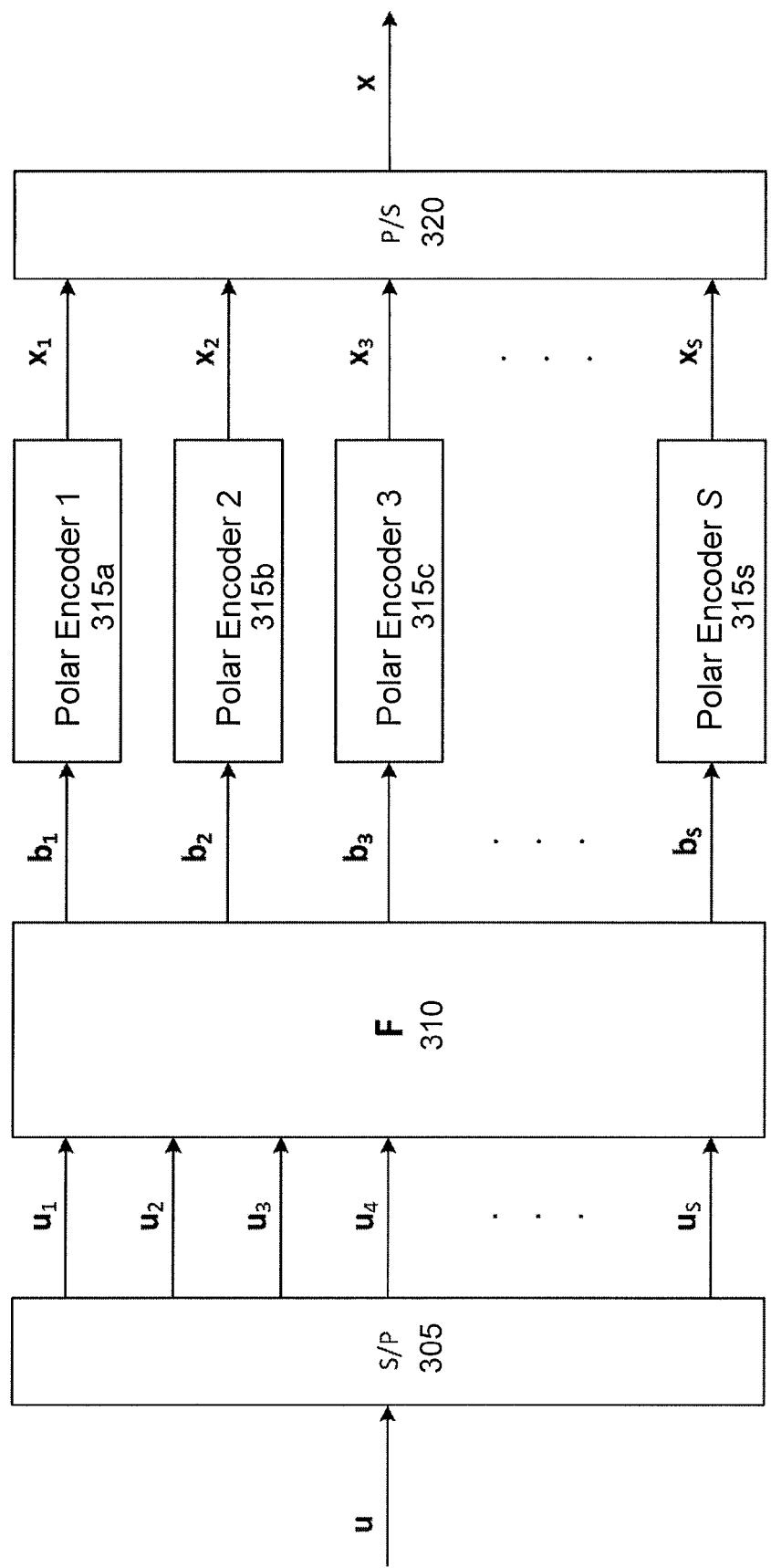
FIG. 3 illustrates an example encoder of a spatially coupled polar code, in accordance with certain embodiments.

FIG. 3 illustrates an example encoder of a spatially coupled polar code, in accordance with certain embodiments. More particularly, FIG. 3 illustrates the encoding process, where S/P and P/S denote serial-to-parallel and parallel-to-serial operations, respectively, and $x=(x_1, x_2, \ldots, x_S)$ is the output of coded bits from different polar codes. In the example of FIG. 3, data bits u to be encoded are subjected to a serial-to-parallel operation at block 305 to generate a plurality of uncoupled information bit vectors $u_1$-$u_5$. Using the coupling matrix F (which has the upper triangular form as described above), at block 310 the node recursively couples the uncoupled information bit vectors $u_1$-$u_5$ to generate the coupled information bits $b_1$-$b_5$ for each polar encoder 315a through 315s. Although the example of FIG. 3 illustrates the use of coupling matrix F, in certain embodiments the matrix E described above may be used.

Each polar encoder 315a through 315s outputs a respective polar coded bit x from their respective coupled information bits b. In the example of FIG. 3, polar encoder 1 315a outputs polar coded bit $x_1$ from coupled information bit $b_1$, polar encoder 2 315b outputs polar coded bit $x_2$ from coupled information bit $b_2$, polar encoder 3 315c outputs polar coded bit $x_3$ from coupled information bits $b_3$, and polar encoder S 315s outputs polar coded bit $x_S$ from coupled information bits. The polar coded bits $x_1$ through $x_S$ are subjected to parallel-to-serial operation at block 320 to generate the encoded wireless transmission x by lining up $x_1$ through $x_S$ in a certain order.

In certain embodiments, no puncturing is necessary for the individual polar encoders 315a-315s, and the output $x_i$ of a polar encoder i has a size of power-of-2. Such an approach, however, may offer limited freedom of overall coded bit length. Thus, in certain embodiments puncturing may be applied to some or all of individual polar encoders i, and the output $x_i$ of a polar encoder i may contain code bits after puncturing. In such a scenario, the length of output $x_i$ does not have a power-of-2 length. In certain embodiments, arbitrary length variation is provided at the cost of higher complexity, which is incurred by the need of defining puncturing pattern(s) for some or all of individual polar encoder i.

The total number of info bits is $k=\Sigma_{i=1}^S k_i$, and the total number of code bits is $N \triangleq \Sigma_{i=1}^S N_i$, yielding an overall coding rate of $R \triangleq k/N$.

As described above, in certain embodiments a node (for example, wireless device 110 or network node 115) receives a wireless transmission encoded using a spatially coupled polar code, the spatially coupled polar code comprising a plurality of sets of information bits at least a portion of which have been coupled, each set of information bits associated with one of a plurality of constituent polar codes. The node decodes the wireless transmission encoded using the spatially coupled polar code using feedforward decoding. The decoding process is described in more detail below.

In certain embodiments, due to the triangular structure of the coupling matrix F, a spatially coupled polar code can be decoded using feedforward decoding. First, the coupled info bit vector $b_1$ is decoded. Then the info bit $u_1$ is decoded. Subsequently, once all the info bit vectors $\{u_j\}$ for $j<i$ and the coupled info bit vector $b_i$ are decoded, then using Equation (4) above, $u_i$, for $i>1$, can be decoded sequentially as $$u_i = b_i \oplus \sum_{j=1}^{i-1} u_j F_{i,j}$$

where $\oplus$ and $\Sigma$ both denote the binary addition or exclusive or (xor) operation in this context, and $F_{i,i}^{\#} \triangleq F_{i,i}^T (F_{i,i} F_{i,i}^T)^{-1}$ denotes the pseudo-inverse of $F_{i,i}$. Note that the decoding of the coupled info bit vector $b_i$ may take into account the decoded info bit vectors $\{u_j\}$ for $j<i$.

The decoding of info bit vectors $\{b_i\}$ can be decoded in several different manners. In one example embodiment, each polar decoder i is run in parallel, and info bit vectors $\{b_i\}$ are produced in general. A parallel hardware architecture may be used. A total of S individual polar decoders need to be implemented and run in parallel. In another example embodiment, the polar decoders are run in serial, so that soft and hard output info i can be utilized by subsequent polar decoder(s) in a pipeline. For instance, if $\{u_j\}$ for $j<i$ are decoded by the (i−1)th Polar decoder, the hard or soft information of the vector $\Sigma_{j=1}^{i-1} u_j F_{i,j}$ can be computed and utilized by the subsequent ith Polar decoder to decode $u_i$, and so forth until $\{u_j\}$ are decoded for all $j \leq S$.

If soft information, for example in terms of log likelihood ratios (LLR) denoted by $L_{b_i}$, of the coupled info bit vectors $\{b_i\}$ can be obtained from individual polar decoders, LLR value $L_{u_1}$ of the info bits $u_1$ can be obtained by soft decoding. The soft information may be derived in multiple ways. In one example embodiment, the soft information is derived based on the maximum a posteriori (MAP) probability of each bit. In another example embodiment, the soft information is derived based on the ML probability of the codeword. Although certain embodiments may be described using examples in which the soft information is in the format of LLR, the present disclosure is not limited to such an example. Rather, the present disclosure contemplates that other types of soft information may be used. As an additional non-limiting example, in certain embodiments the soft information may be in the format of a Euclidean distance calculation.

Subsequently, based on Equation (4), the LLR of $u_i$, denoted by $L_{u_i}$ for $i>1$, can be decoded sequentially as:

$$L_{u_i} = L_{b_i} \boxplus \sum_{j=1}^{i-1} L_{u_j} F_{i,j}$$

where $$x \boxplus y \triangleq 2 \tanh^{-1}\left(\tanh\left(\frac{x}{2}\right)\tanh\left(\frac{y}{2}\right)\right)$$

denotes a soft addition operation for LLR values, where $\tilde{F}_{i,j}$ and $\tilde{F}_{i,i}^{\#}$ are real-valued matrices derived from the corresponding binary-valued $F_{i,j}$ and $F_{i,i}^{\#}$ respectively with binary-value of zero replaced by real-value of +1 and binary value of one replaced by real value of −1, and where the summation and addition operations are performed based on such a soft addition operation. Note that the decoding of the LLR $L_{u_i}$ of $b_i$ may take into account the decoded LLR $\{L_{u_j}\}$ info bit vectors $\{u_j\}$ for $j<i$.

Figure 4:
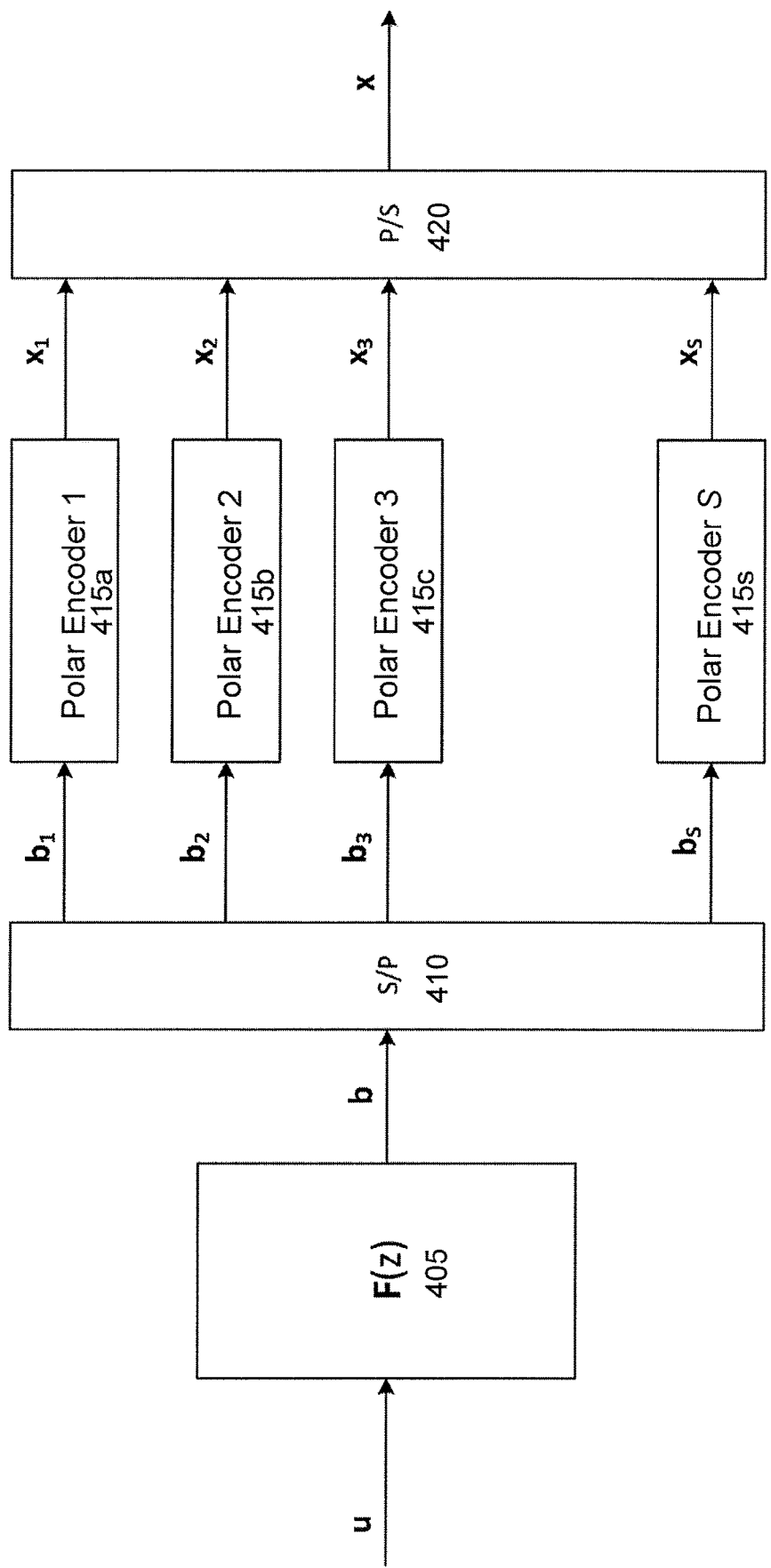
FIG. 4 illustrates an example of encoding of a concatenated convolutional-polar code, in accordance with certain embodiments.

In certain embodiments, the spatially coupled polar code may be a concatenated convolutional-polar code. Consider the case when all S Polar codes have the same sizes (i.e., $k_i=k_j$, $K_i=K_j$, $N_i=N_j$ for all $i \neq j$), and when the generator matrix F is a banded Toeplitz matrix (i.e., $F_{i,j}=F_{k,l}$ if $|i-j|=|k-l|$ and $F_{i,j}=0$ if $|i-j|>M$, for some integer $M>0$). In such a case, by defining $u_j \triangleq 0$ for all $j \leq 0$, Equation (4) can be expressed in the following form:

$$b_i = \sum_{j=i-M}^{i} u_j F_{i,j} = \sum_{m=0}^{M} u_{i-m} F_m$$

for $i \in \{1, 2, \ldots, S\}$, where $F_m \triangleq F_{i,i-m}$ for all $i > m$, which can be implemented using a multi-dimensional convolutional outer code, which is characterized by the polynomial $$F(z) \triangleq \Sigma_{m=0}^{M} F_m z^m,$$

as illustrated in FIG. 4.

FIG. 4 illustrates an example of encoding of a concatenated convolutional-polar code, in accordance with certain embodiments. In the example of FIG. 4, polynomial F(z) is applied at block 405 to data bits u to generate coupled information bits b. The coupled info bits $b=(b_1, b_2, \ldots, b_S)$ for the S Polar codes can be obtained from the independent info bits $u=(u_1, u_2, \ldots, u_S)$ by a polynomial multiplication operation given by $$b(z)=u(z)F(z)$$

where $b(z) \triangleq \Sigma_{i=1}^{S} b_i z^{i-1}$ and $u(z) \triangleq \Sigma_{i=1}^{S} u_i z^{i-1}$.

In the example of FIG. 4, the coupled information bits b are subjected to a serial-to-parallel operation at block 410 to generate a plurality of coupled information bits $b_1$, $b_2, \ldots, b_S$. Each polar encoder 415*a* through 415*s* outputs a respective polar coded bit x from their respective coupled information bits $b_1, b_2, \ldots, b_S$. In the example of FIG. 4, polar encoder 1 415*a* outputs polar coded bit $x_1$ from coupled information bit $b_1$, polar encoder 2 415*b* outputs polar coded bit $x_2$ from coupled information bit $b_2$, polar encoder 3 415*c* outputs polar coded bit $x_3$ from coupled information bits $b_3$, and polar encoder S 315*s* outputs polar coded bit $x_S$ from coupled information bit s. The polar coded bits $x_1$ through $x_S$ are subjected to parallel-to-serial operation at block 420 to generate the encoded wireless transmission x.

In certain embodiments, the spatially coupled polar code may comprise a parallel concatenated polar code (PCP). When the generator matrix F in Equation (3) described above has a special structure where for any given $i \in \{1, 2, \ldots, S\}$, the non-zero columns of $F_{i,j}$ are non-overlapping with the non-zero columns of $F_{i,l}$ for any $j \neq l$. In this case, the spatially coupled polar codes is similar to the PCP codes described in S. Hong, D. Hui, I. Marie, "Capacity Achieving Rate-Compatible Polar Codes," Proc. ISIT, Barcelona, July 2016 that was proposed for hybrid ARQ retransmission, where some of the input information bits of each constituent polar code are exactly the same as some of the input info bits of other constituent polar codes. The PCP codes can also be used in a single transmission as well.

Figure 5:
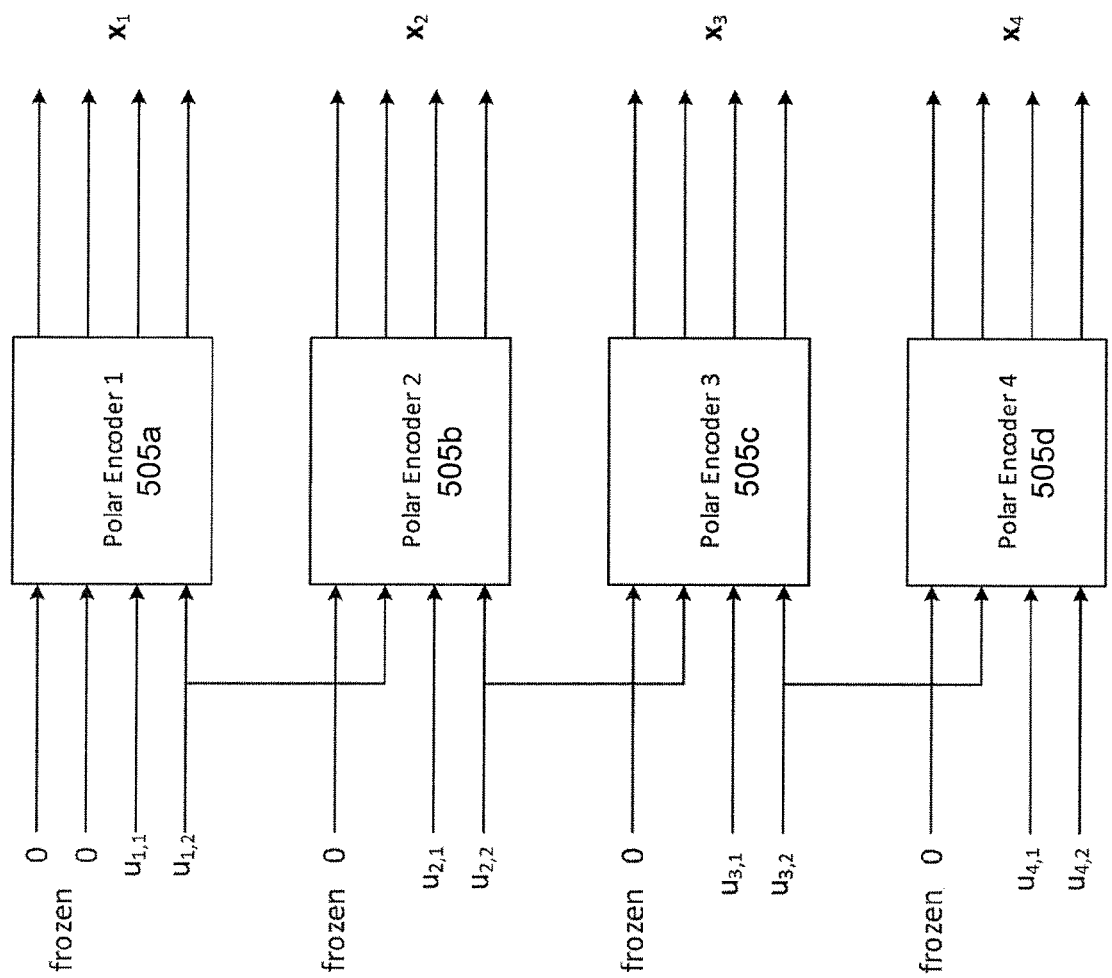
FIG. 5 illustrates an example of encoding of a parallel concatenated polar code, in accordance with certain embodiments.

FIG. 5 illustrates an example of encoding of a PCP code, in accordance with certain embodiments. More particularly, FIG. 5 illustrates an example of an encoder of a PCP code comprising a plurality of polar encoders 505*a*-505*d* with S=4, $K_i=3$, and $N_i=4$ for all i. As illustrated in FIG. 5, information bit locations of high reliability in one polar code may be coupled with information bit location of low reliability in another polar code.

To decode a PCP code at a receiver, some of the decoded bits of one polar code may be used as frozen bits when decoding another polar code (e.g. after $u_{1,2}$ is decoded, it can be used to decode $u_{2,1}$ and $u_{2,2}$ of polar code 2).

Figure 6:
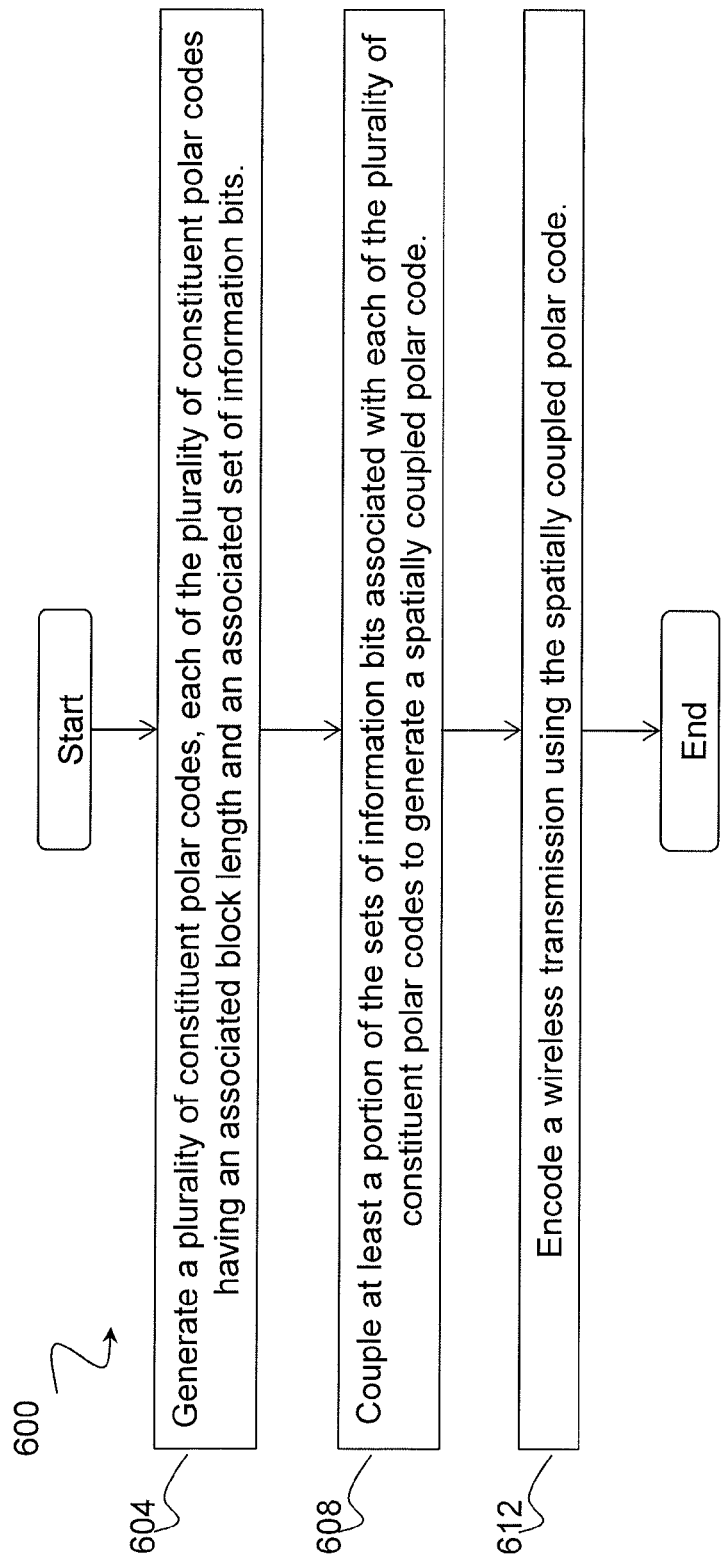
FIG. 6 is a flow diagram of a method in a node, in accordance with certain embodiments.

FIG. 6 is a flow diagram of a method 600 in a node, in accordance with certain embodiments. In certain embodiments, the node may be a wireless device (e.g., wireless device 110 described above in relation to FIG. 2). In certain embodiments, the node may be a network node (e.g., network node 115 described above in relation to FIG. 2). Method 600 begins at step 604, where the node generates a plurality of constituent polar codes, each of the plurality of constituent polar codes having an associated block length and an associated set of information bits.

At step 608, the node couples at least a portion of the sets of information bits associated with each of the plurality of constituent polar codes to generate a spatially coupled polar code. In certain embodiments, coupling at least a portion of the sets of information bits associated with each of the plurality of constituent polar codes to generate a spatially coupled polar code may comprise using a first subset of information bits in a first set of information bits associated with a first constituent polar code to form one or more information bits of another set of information bits associated with another constituent polar code of the plurality of constituent polar codes. In certain embodiments, a block length of the spatially coupled polar code may be equal to the sum of the block length of each of the plurality of constituent polar codes.

In certain embodiments, the at least a portion of the sets of information bits associated with each of the plurality of constituent polar codes may be coupled using a coupling matrix that specifies how information bits from a first constituent polar code of the plurality of constituent polar codes are coupled to one or more other constituent polar codes of the plurality of constituent polar codes. The coupling matrix may comprise elements from a binary Galois field. The coupling matrix may be expressed as a block-wise upper triangular form.

At step 612, the node encodes a wireless transmission using the spatially coupled polar code. In certain embodiments, encoding a wireless transmission using the spatially coupled polar code may comprise determining, for each of a plurality of polar encoders, an associated set of coupled information bits, and running each of the plurality of polar encoders by, for each of the plurality of polar encoders, putting the associated set of coupled information bits into information bit locations based on an interleaving function and freezing a plurality of other bit locations to zero. In certain embodiments, the method may comprise puncturing a plurality of bits of an individual polar encoder of the plurality of polar encoders such that an output of the individual polar encoder has a length other than a power of 2. In certain embodiments, the method may comprise refraining from puncturing bits for individual polar encoders of the plurality of polar encoders such that an output of the individual polar encoder has a length that is a power of 2.

In certain embodiments, each of the plurality of constituent polar codes may have the same size, the coupling matrix may be a banded Toeplitz matrix, and the spatially coupled polar code may be a concatenated convolutional-polar code.

In certain embodiments, a first subset of information bits in a first set of information bits associated with a first constituent polar code may be identical to another subset of information bits in another set of information bits associated with another constituent polar code. A plurality of information bits having high reliability in the first set of information bits associated with the first constituent polar code may be coupled with other information bits having low reliability in the other set of information bits associated with the other constituent polar code. In certain embodiments, information bits having a high reliability may be those carried by bit-channels of high quality (e.g., nearly perfect bit channels) while information bits having a low reliability may be those carried by bit-channels of low quality (e.g., nearly useless bit channels). The spatially coupled polar code may comprise a parallel concatenated polar code.

In certain embodiments, the method may comprise transmitting the wireless transmission encoded using the spatially coupled polar code.

Figure 7:
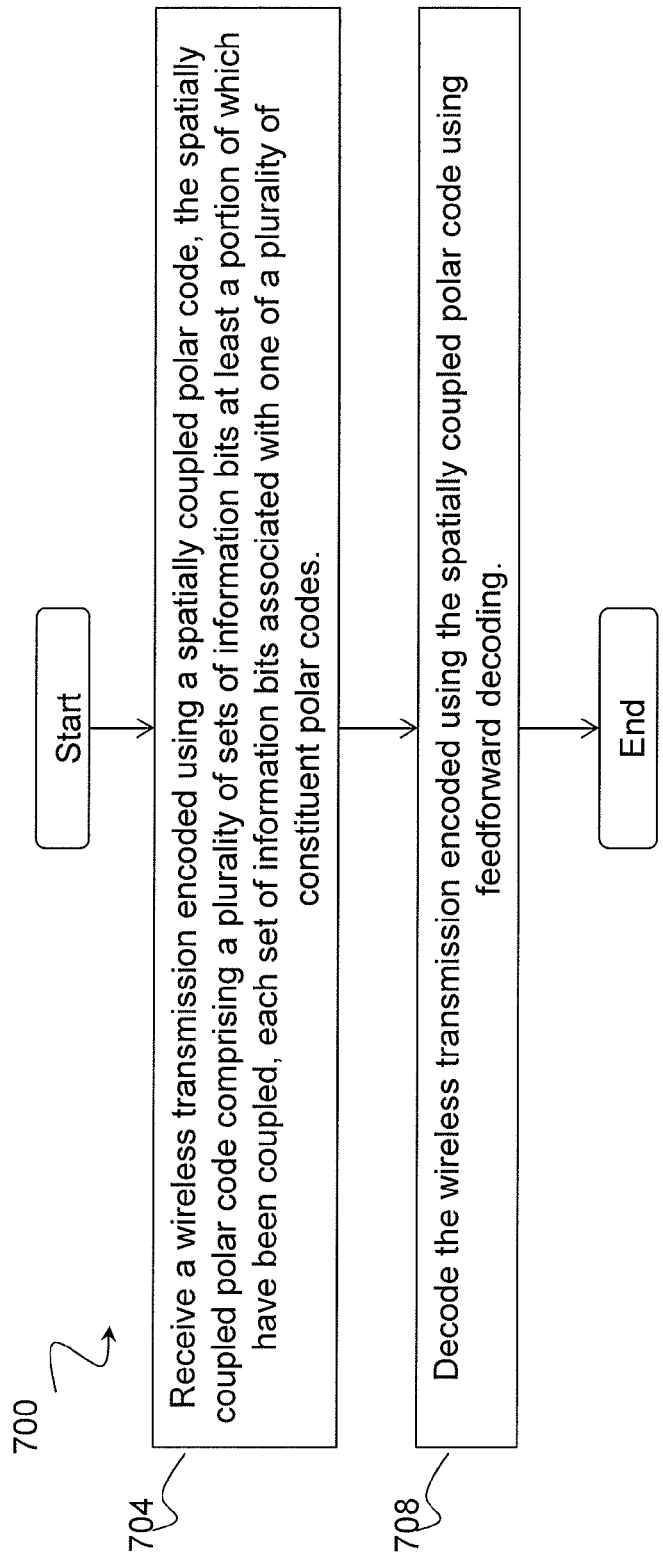
FIG. 7 is a flow diagram of a method in a node, in accordance with certain embodiments.

FIG. 7 is a flow diagram of a method 700 in a node, in accordance with certain embodiments. In certain embodiments, the node may be a wireless device (e.g., wireless device 110 described above in relation to FIG. 2). In certain embodiments, the node may be a network node (e.g., network node 115 described above in relation to FIG. 2). Method 700 begins at step 704, where the node receives a wireless transmission encoded using a spatially coupled polar code, the spatially coupled polar code comprising a plurality of sets of information bits at least a portion of which have been coupled, each set of information bits associated with one of a plurality of constituent polar codes.

In certain embodiments, a block length of the spatially coupled polar code may be equal to the sum of the block length of each of the plurality of constituent polar codes. In certain embodiments, the spatially coupled polar code may be a concatenated convolutional-polar code. In certain embodiments, the spatially coupled polar code may be a parallel concatenated polar code.

At step 708, the node decodes the wireless transmission encoded using the spatially coupled polar code using feedforward decoding. In certain embodiments, decoding the wireless transmission encoded using the spatially coupled polar code using feedforward decoding may comprise: decoding a plurality of coupled information bit vectors; decoding a first information bit; and decoding one or more remaining information bits sequentially.

In certain embodiments, decoding the plurality of coupled information bit vectors may comprise running each of a plurality of polar decoders in parallel, wherein each of the plurality of polar decoders is associated with one of the plurality of constituent polar codes. In certain embodiments, decoding the plurality of coupled information bit vectors may comprise: running a plurality of polar decoders in series, the plurality of polar decoders comprising a first polar decoder, wherein each of the plurality of polar decoders is associated with one of the plurality of constituent polar codes; generating, by the first polar decoder, one or more of soft output information and hard output information; and providing, from the first polar decoder to at least one subsequent polar decoder in a series of the plurality of polar decoders, one or more of the soft output information and hard output information generated by the first polar decoder. In certain embodiments, the soft output information may comprise a log likelihood ratio.

Figure 8:
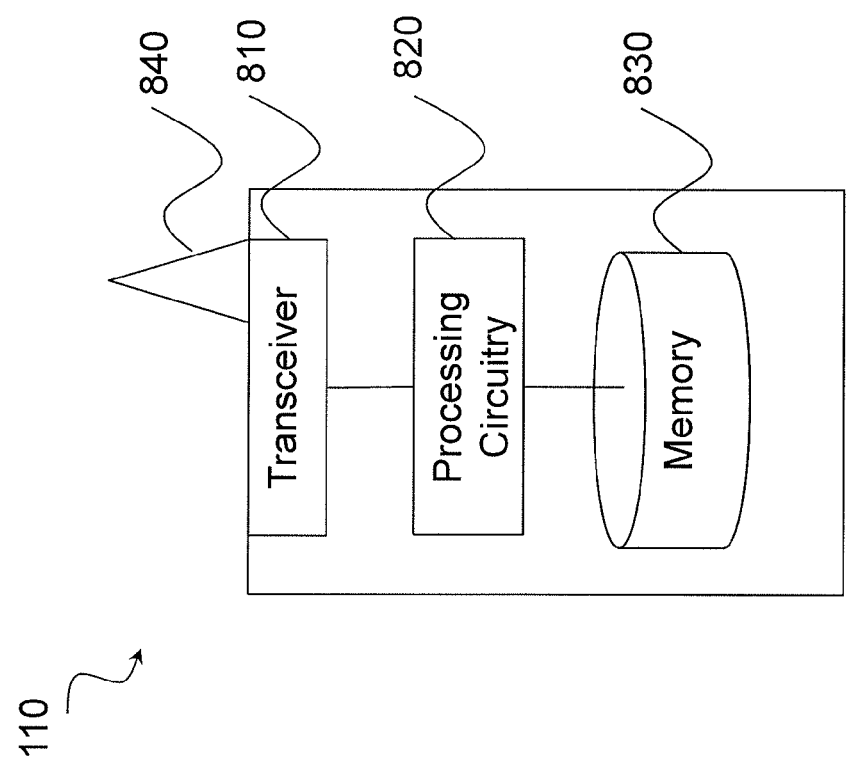
FIG. 8 is a block schematic of an exemplary wireless device, in accordance with certain embodiments.

FIG. 8 is a block schematic of an exemplary wireless device 110, in accordance with certain embodiments. Wireless device 110 may refer to any type of wireless device communicating with a node and/or with another wireless device in a cellular or mobile communication system. Examples of wireless device 110 include a mobile phone, a smart phone, a PDA, a portable computer (e.g., laptop, tablet), a sensor, an actuator, a modem, a MTC device/M2M device, LEE, LME, USB dongles, a D2D capable device, or another device that can provide wireless communication. A wireless device 110 may also be referred to as UE, a station (STA), a device, or a terminal in some embodiments. Wireless device 110 includes transceiver 810, processing circuitry 820, and memory 830. In some embodiments, transceiver 810 facilitates transmitting wireless signals to and receiving wireless signals from network node 115 (e.g., via antenna 840), processing circuitry 820 executes instructions to provide some or all of the functionality described above as being provided by wireless device 110, and memory 830 stores the instructions executed by processing circuitry 820.

Processing circuitry 820 may include any suitable combination of hardware and software implemented in one or more modules to execute instructions and manipulate data to perform some or all of the described functions of wireless device 110, such as the functions of wireless device 110 described above in relation to FIGS. 1-7. In some embodiments, processing circuitry 820 may include, for example, one or more computers, one or more central processing units (CPUs), one or more microprocessors, one or more applications, one or more application specific integrated circuits (ASICs), one or more field programmable gate arrays (FPGAs) and/or other logic.

Memory 830 is generally operable to store instructions, such as a computer program, software, an application including one or more of logic, rules, algorithms, code, tables, etc. and/or other instructions capable of being executed by processing circuitry 820. Examples of memory 830 include computer memory (for example, Random Access Memory (RAM) or ROM), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information, data, and/or instructions that may be used by processing circuitry 820.

Other embodiments of wireless device 110 may include additional components beyond those shown in FIG. 8 that may be responsible for providing certain aspects of the wireless device's functionality, including any of the functionality described above and/or any additional functionality (including any functionality necessary to support the solution described above). As just one example, wireless device 110 may include input devices and circuits, output devices, and one or more synchronization units or circuits, which may be part of the processing circuitry 820. Input devices include mechanisms for entry of data into wireless device 110. For example, input devices may include input mechanisms, such as a microphone, input elements, a display, etc. Output devices may include mechanisms for outputting data in audio, video and/or hard copy format. For example, output devices may include a speaker, a display, etc.

Figure 9:
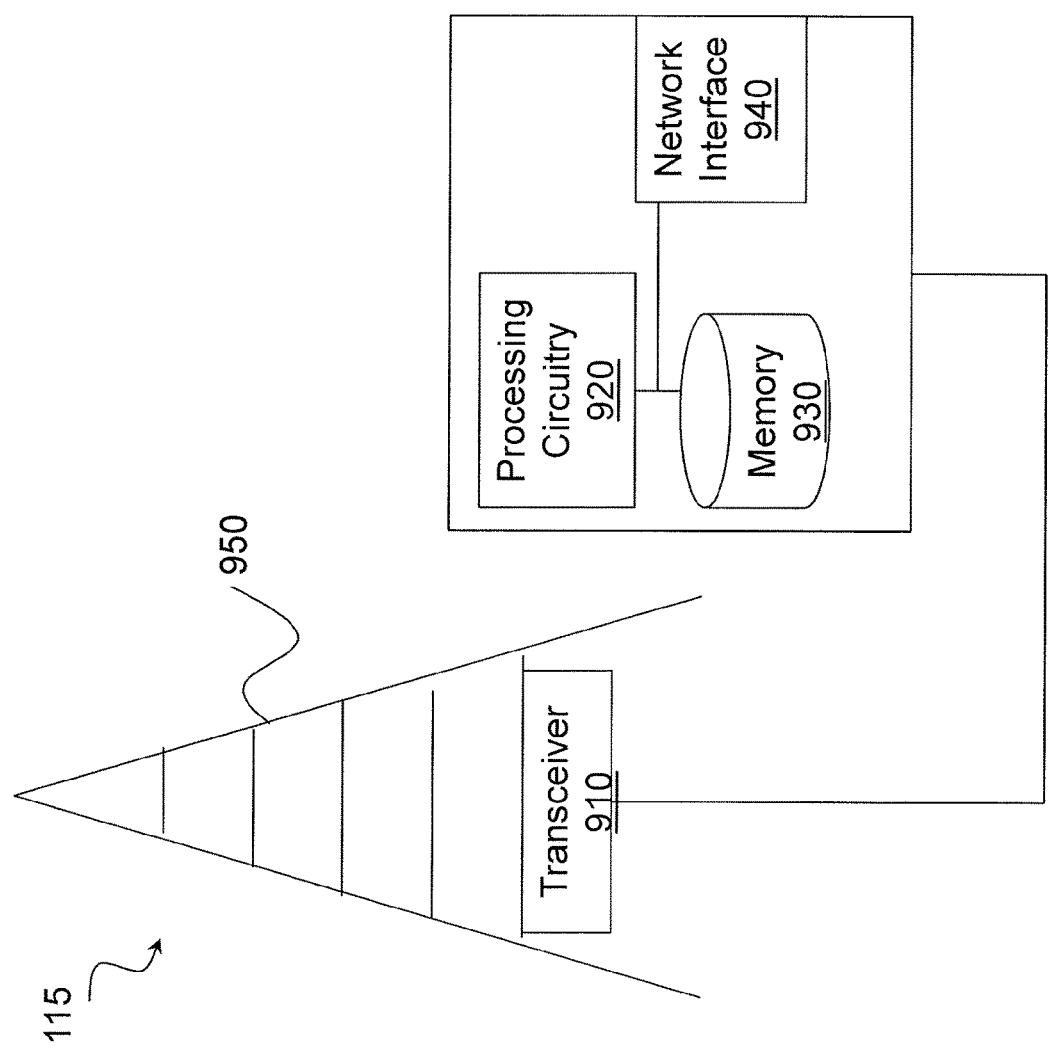
FIG. 9 is a block schematic of an exemplary network node, in accordance with certain embodiments.

FIG. 9 is a block schematic of an exemplary network node 115, in accordance with certain embodiments. Network node 115 may be any type of radio network node or any network node that communicates with a UE and/or with another network node. Examples of network node 115 include an eNB, a gNB, a node B, a BS, a wireless AP (e.g., a Wi-Fi AP), a low power node, a BTS, relay, donor node controlling relay, transmission points, transmission nodes, RRU, RRH, MSR radio node such as MSR BS, nodes in DAS, O&M, OSS, SON, positioning node (e.g., E-SMLC), MDT, or any other suitable network node. Network nodes 115 may be deployed throughout network 100 as a homogenous deployment, heterogeneous deployment, or mixed deployment. A homogeneous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 910, processing circuitry 920, memory 930, and network interface 940. In some embodiments, transceiver 910 facilitates transmitting wireless signals to and receiving wireless signals from wireless device 110 (e.g., via antenna 950), processing circuitry 920 executes instructions to provide some or all of the functionality described above as being provided by a network node 115, memory 930 stores the instructions executed by processing circuitry 920, and network interface 940 communicates signals to backend network components, such as a gateway, switch, router, Internet, PSTN, core network nodes or radio network controllers 130, etc.

Processing circuitry 920 may include any suitable combination of hardware and software implemented in one or more modules to execute instructions and manipulate data to perform some or all of the described functions of network node 115, such as those described above in relation to FIGS. 1-7. In some embodiments, processing circuitry 920 may include, for example, one or more computers, one or more CPUs, one or more microprocessors, one or more applications, one or more ASICs, one or more FPGAs, and/or other logic.

Memory 930 is generally operable to store instructions, such as a computer program, software, an application including one or more of logic, rules, algorithms, code, tables, etc. and/or other instructions capable of being executed by processing circuitry 920. Examples of memory 930 include computer memory (for example, RAM or ROM), mass storage media (for example, a hard disk), removable storage media (for example, a CD or a DVD), and/or or any other volatile or non-volatile, non-transitory computer-readable and/or computer-executable memory devices that store information.

In some embodiments, network interface 940 is communicatively coupled to processing circuitry 920 and may refer to any suitable device operable to receive input for network node 115, send output from network node 115, perform suitable processing of the input or output or both, communicate to other devices, or any combination of the preceding. Network interface 940 may include appropriate hardware (e.g., port, modem, network interface card, etc.) and software, including protocol conversion and data processing capabilities, to communicate through a network.

Other embodiments of network node 115 may include additional components beyond those shown in FIG. 9 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Figure 10:
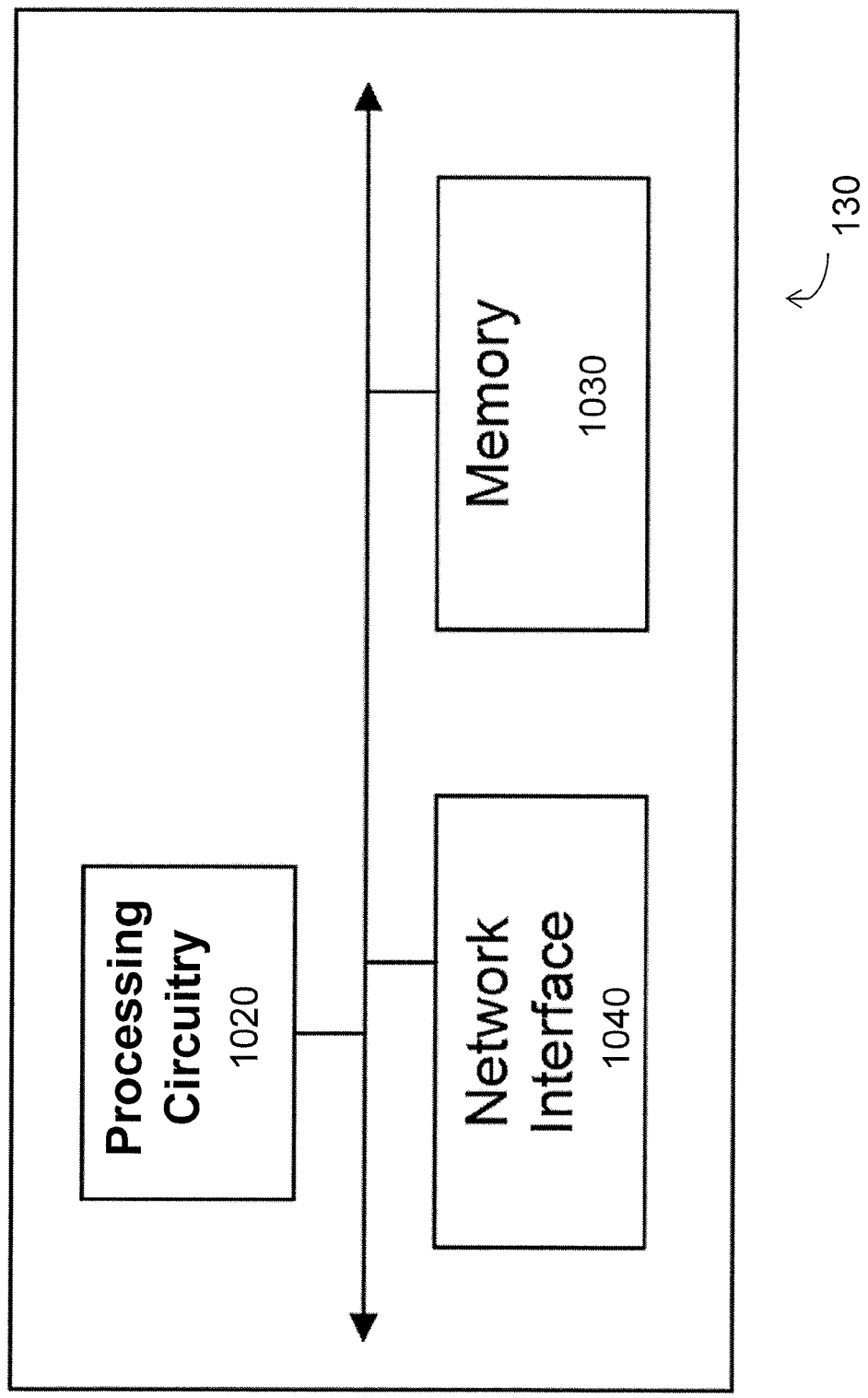
FIG. 10 is a block schematic of an exemplary radio network controller or core network node, in accordance with certain embodiments.

FIG. 10 is a block schematic of an exemplary radio network controller or core network node 130, in accordance with certain embodiments. Examples of network nodes can include a MSC, a serving GPRS support node (SGSN), a MME, a RNC, a BSC, and so on. The radio network controller or core network node 130 includes processing circuitry 1020, memory 1030, and network interface 1040. In some embodiments, processing circuitry 1020 executes instructions to provide some or all of the functionality described above as being provided by the network node, memory 1030 stores the instructions executed by processing circuitry 1020, and network interface 1040 communicates signals to any suitable node, such as a gateway, switch, router, Internet, PSTN, network nodes 115, radio network controllers or core network nodes 130, etc.

Processing circuitry 1020 may include any suitable combination of hardware and software implemented in one or more modules to execute instructions and manipulate data to perform some or all of the described functions of the radio network controller or core network node 130. In some embodiments, processing circuitry 1020 may include, for example, one or more computers, one or more CPUs, one or more microprocessors, one or more applications, one or more ASICs, one or more FPGAs, and/or other logic.

Memory 1030 is generally operable to store instructions, such as a computer program, software, an application including one or more of logic, rules, algorithms, code, tables, etc. and/or other instructions capable of being executed by processing circuitry 1020. Examples of memory 1030 include computer memory (for example, RAM or ROM), mass storage media (for example, a hard disk), removable storage media (for example, a CD or a DVD), and/or or any other volatile or non-volatile, non-transitory computer-readable and/or computer-executable memory devices that store information.

In some embodiments, network interface 1040 is communicatively coupled to processing circuitry 1020 and may refer to any suitable device operable to receive input for the network node, send output from the network node, perform suitable processing of the input or output or both, communicate to other devices, or any combination of the preceding. Network interface 1040 may include appropriate hardware (e.g., port, modem, network interface card, etc.) and software, including protocol conversion and data processing capabilities, to communicate through a network.

Other embodiments of the network node may include additional components beyond those shown in FIG. 10 that may be responsible for providing certain aspects of the network node's functionality, including any of the functionality described above and/or any additional functionality (including any functionality necessary to support the solution described above).

FIG. 11 is a schematic block diagram of an exemplary wireless device, in accordance with certain embodiments. Wireless device 110 may include one or more modules. For example, wireless device 110 may include a determining module 1110, a communication module 1120, a receiving module 1130, an input module 1140, a display module 1150, and any other suitable modules. In some embodiments, one or more of determining module 1110, communication module 1120, receiving module 1130, input module 1140, display module 1150, or any other suitable module may be implemented using one or more processors, such as processing circuitry 820 described above in relation to FIG. 8. In certain embodiments, the functions of two or more of the various modules may be combined into a single module. Wireless device 110 may perform the methods related to spatially coupled polar codes described above in relation to FIGS. 1-7.

Determining module 1110 may perform the processing functions of wireless device 110. In certain embodiments, wireless device 110 may perform the functions of the node described above. For example, determining module 1110 may generate a plurality of constituent polar codes, each of the plurality of constituent polar codes having an associated block length and an associated set of information bits. As another example, determining module 1110 may couple at least a portion of the sets of information bits associated with each of the plurality of constituent polar codes to generate a spatially coupled polar code. In certain embodiments, determining module 1110 may couple that at least a portion of the sets of information bits associated with each of the plurality of constituent polar codes to generate a spatially coupled polar code by using a first subset of information bits in a first set of information bits associated with a first constituent polar code to form one or more information bits of another set of information bits associated with another constituent polar code of the plurality of constituent polar codes.

As still another example, determining module 1110 may encode a wireless transmission using the spatially coupled polar code. In certain embodiments, determining module 1110 may encode the wireless transmission using the spatially coupled polar code by determining, for each of a plurality of polar encoders, an associated set of coupled information bits; and running each of the plurality of polar encoders by, for each of the plurality of polar encoders, putting the associated set of coupled information bits into information bit locations based on an interleaving function and freezing a plurality of other bit locations to zero.

As yet another example, determining module 1110 may puncture a plurality of bits of an individual polar encoder of the plurality of polar encoders such that an output of the individual polar encoder has a length other than a power of 2. As another example, determining module 1110 may refrain from puncturing bits for individual polar encoders of the plurality of polar encoders such that an output of the individual polar encoder has a length that is a power of 2.

As another example, determining module 1110 may decode a wireless transmission encoded using the spatially coupled polar code using feedforward decoding. In certain embodiments, determining module 1110 may decode the wireless transmission encoded using the spatially coupled polar code using feedforward decoding by: decoding a plurality of coupled information bit vectors; decoding a first information bit; and decoding one or more remaining information bits sequentially. In certain embodiments, determining module 1110 may decode the plurality of coupled information bit vectors by running each of a plurality of polar decoders in parallel, wherein each of the plurality of polar decoders is associated with one of the plurality of constituent polar codes. In certain embodiments, determining module 1110 may decode the plurality of coupled information bit vectors by: running a plurality of polar decoders in series, the plurality of polar decoders comprising a first polar decoder, wherein each of the plurality of polar decoders is associated with one of the plurality of constituent polar codes; generating, by the first polar decoder, one or more of soft output information and hard output information; and providing, from the first polar decoder to at least one subsequent polar decoder in a series of the plurality of polar decoders, one or more of the soft output information and hard output information generated by the first polar decoder.

Determining module 1110 may include or be included in one or more processors, such as processing circuitry 820 described above in relation to FIG. 8. Determining module 1110 may include analog and/or digital circuitry configured to perform any of the functions of determining module 1110 and/or processing circuitry 820 described above. The functions of determining module 1110 described above may, in certain embodiments, be performed in one or more distinct modules.

Communication module 1120 may perform the transmission functions of wireless device 110. In certain embodiments, wireless device 110 may perform the functions of the node described above. For example, communication module 1120 may transmit the wireless transmission encoded using the spatially coupled polar code. Communication module 1120 may include a transmitter and/or a transceiver, such as transceiver 810 described above in relation to FIG. 8. Communication module 1120 may include circuitry configured to wirelessly transmit messages and/or signals. In particular embodiments, communication module 1120 may receive messages and/or signals for transmission from determining module 1110. In certain embodiments, the functions of communication module 1120 described above may be performed in one or more distinct modules.

Receiving module 1130 may perform the receiving functions of wireless device 110. In certain embodiments, wireless device 110 may perform the functions of the node described above. For example, receiving module 1130 may receive a wireless transmission encoded using a spatially coupled polar code, the spatially coupled polar code comprising a plurality of sets of information bits at least a portion of which have been coupled, each set of information bits associated with one of a plurality of constituent polar codes. Receiving module 1130 may include a receiver and/or a transceiver. Receiving module 1130 may include a receiver and/or a transceiver, such as transceiver 810 described above in relation to FIG. 8. Receiving module 1130 may include circuitry configured to wirelessly receive messages and/or signals. In particular embodiments, receiving module 1130 may communicate received messages and/or signals to determining module 1110. The functions of receiving module 1130 described above may, in certain embodiments, be performed in one or more distinct modules.

Input module 1140 may receive user input intended for wireless device 110. For example, the input module may receive key presses, button presses, touches, swipes, audio signals, video signals, and/or any other appropriate signals. The input module may include one or more keys, buttons, levers, switches, touchscreens, microphones, and/or cameras. The input module may communicate received signals to determining module 1110. The functions of input module 1140 described above may, in certain embodiments, be performed in one or more distinct modules.

Display module 1150 may present signals on a display of wireless device 110. Display module 1150 may include the display and/or any appropriate circuitry and hardware configured to present signals on the display. Display module 1150 may receive signals to present on the display from determining module 1110. The functions of display module 1150 described above may, in certain embodiments, be performed in one or more distinct modules.

Determining module 1110, communication module 1120, receiving module 1130, input module 1140, and display module 1150 may include any suitable configuration of hardware and/or software. Wireless device 110 may include additional modules beyond those shown in FIG. 11 that may be responsible for providing any suitable functionality, including any of the functionality described above and/or any additional functionality (including any functionality necessary to support the various solutions described herein).

FIG. 12 is a schematic block diagram of an exemplary network node 115, in accordance with certain embodiments. Network node 115 may include one or more modules. For example, network node 115 may include determining module 1210, communication module 1220, receiving module 1230, and any other suitable modules. In some embodiments, one or more of determining module 1210, communication module 1220, receiving module 1230, or any other suitable module may be implemented using one or more processors, such as processing circuitry 920 described above in relation to FIG. 9. In certain embodiments, the functions of two or more of the various modules may be combined into a single module. Network node 115 may perform the methods related to spatially coupled polar codes described above with respect to FIGS. 1-7.

Determining module 1210 may perform the processing functions of network node 115. In certain embodiments, network node 115 may perform the functions of the node described above. For example, determining module 1210 may generate a plurality of constituent polar codes, each of the plurality of constituent polar codes having an associated block length and an associated set of information bits. As another example, determining module 1210 may couple at least a portion of the sets of information bits associated with each of the plurality of constituent polar codes to generate a spatially coupled polar code. In certain embodiments, determining module 1210 may couple that at least a portion of the sets of information bits associated with each of the plurality of constituent polar codes to generate a spatially coupled polar code by using a first subset of information bits in a first set of information bits associated with a first constituent polar code to form one or more information bits of another set of information bits associated with another constituent polar code of the plurality of constituent polar codes.

As still another example, determining module 1210 may encode a wireless transmission using the spatially coupled polar code. In certain embodiments, determining module 1210 may encode the wireless transmission using the spatially coupled polar code by determining, for each of a plurality of polar encoders, an associated set of coupled information bits; and running each of the plurality of polar encoders by, for each of the plurality of polar encoders, putting the associated set of coupled information bits into information bit locations based on an interleaving function and freezing a plurality of other bit locations to zero.

As yet another example, determining module 1210 may puncture a plurality of bits of an individual polar encoder of the plurality of polar encoders such that an output of the individual polar encoder has a length other than a power of 2. As another example, determining module 1210 may refrain from puncturing bits for individual polar encoders of the plurality of polar encoders such that an output of the individual polar encoder has a length that is a power of 2.

As another example, determining module 1210 may decode a wireless transmission encoded using the spatially coupled polar code using feedforward decoding. In certain embodiments, determining module 1210 may decode the wireless transmission encoded using the spatially coupled polar code using feedforward decoding by: decoding a plurality of coupled information bit vectors; decoding a first information bit; and decoding one or more remaining information bits sequentially. In certain embodiments, determining module 1210 may decode the plurality of coupled information bit vectors by running each of a plurality of polar decoders in parallel, wherein each of the plurality of polar decoders is associated with one of the plurality of constituent polar codes. In certain embodiments, determining module 1210 may decode the plurality of coupled information bit vectors by: running a plurality of polar decoders in series, the plurality of polar decoders comprising a first polar decoder, wherein each of the plurality of polar decoders is associated with one of the plurality of constituent polar codes; generating, by the first polar decoder, one or more of soft output information and hard output information; and providing, from the first polar decoder to at least one subsequent polar decoder in a series of the plurality of polar decoders, one or more of the soft output information and hard output information generated by the first polar decoder.

Determining module 1210 may include or be included in one or more processors, such as processing circuitry 920 described above in relation to FIG. 9. Determining module 1210 may include analog and/or digital circuitry configured to perform any of the functions of determining module 1210 and/or processing circuitry 920 described above. The functions of determining module 1210 may, in certain embodiments, be performed in one or more distinct modules.

Communication module 1220 may perform the transmission functions of network node 115. In certain embodiments, network node 115 may perform the functions of the node described above. For example, communication module 1220 may transmit the wireless transmission encoded using the spatially coupled polar code. Communication module 1220 may transmit messages to one or more of wireless devices 110. Communication module 1220 may include a transmitter and/or a transceiver, such as transceiver 910 described above in relation to FIG. 9. Communication module 1220 may include circuitry configured to wirelessly transmit messages and/or signals. In particular embodiments, communication module 1220 may receive messages and/or signals for transmission from determining module 1210 or any other module. The functions of communication module 1220 may, in certain embodiments, be performed in one or more distinct modules.

Receiving module 1230 may perform the receiving functions of network node 115. In certain embodiments, network node 115 may perform the functions of the node described above. For example, receiving module 1230 may receive a wireless transmission encoded using a spatially coupled polar code, the spatially coupled polar code comprising a plurality of sets of information bits at least a portion of which have been coupled, each set of information bits associated with one of a plurality of constituent polar codes. Receiving module 1230 may receive any suitable information from a wireless device. Receiving module 1230 may include a receiver and/or a transceiver, such as transceiver 910 described above in relation to FIG. 9. Receiving module 1230 may include circuitry configured to wirelessly receive messages and/or signals. In particular embodiments, receiving module 1230 may communicate received messages and/or signals to determining module 1210 or any other suitable module. The functions of receiving module 1230 may, in certain embodiments, be performed in one or more distinct modules.

Determining module 1210, communication module 1220, and receiving module 1230 may include any suitable configuration of hardware and/or software. Network node 115 may include additional modules beyond those shown in FIG. 12 that may be responsible for providing any suitable functionality, including any of the functionality described above and/or any additional functionality (including any functionality necessary to support the various solutions described herein).

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components.

Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations Used in the Preceding Description Include

3GPP $3^{rd}$ Generation Partnership Project
AP Access Point
ASIC Application Specific Integrated Circuit
BER Block Error Rate
BP Belief Propagation
BS Base Station
BSC Base Station Controller
BTS Base Transceiver Station
CD Compact Disk
CPE Customer Premises Equipment
CPU Central Processing Unit
CRC Cyclic Redundancy Check
D2D Device-to-device
DAS Distributed Antenna System
DL Downlink
DRX Discontinuous Reception
DVD Digital Video Disk
eNB evolved Node B
E-SMLC Evolved Serving Mobile Location Center
FPGA Field Programmable Gate Array
GPS Global Positioning System
GSM Global System for Mobile Communications
HARQ Hybrid Automatic Repeat Request
IoT Internet of Things
IP Internet Protocol
IR Incremental Redundancy
LAN Local Area Network
LDPC Low-Density Parity-Check
LEE Laptop Embedded Equipment
LLR Log-Likelihood Ratio
LME Laptop Mounted Equipment
LTE Long Term Evolution
M2M Machine-to-Machine
MAC Message Authentication Code
MAN Metropolitan Area Network
MAP Maximum A Posteriori
MCE Multi-cell/multicast Coordination Entity
MCG Master Cell Group
MCS Modulation level and coding scheme
MDT Minimization of Drive Test
MeNB Master eNodeB
ML Maximum Likelihood
MME Mobility Management Entity
MSC Mobile Switching Center
MSR Multi-standard Radio
MTC Machine-Type Communication
NAS Non-Access Stratum
NB-IoT Narrow band Internet of Things
NR New Radio
O&M Operations and Management
OSS Operations Support System
PSTN Public Switched Telephone Network
RAM Random Access Memory
RAN Radio Access Network
RAT Radio Access Technology
RNC Radio Network Controller
ROM Read-Only Memory
RRC Radio Resource Control
RRH Remote Radio Head
RRU Remote Radio Unit
SC Successive Cancellation
SCG Secondary Cell Group
SCL Successive Cancellation List
SeNB Secondary eNodeB
SON Self-Organizing Network
UE User Equipment
UL Uplink
UMTS Universal Mobile Telecommunications System
VOIP Voice Over Internet Protocol
WAN Wide Area Network
WiMax Worldwide Interoperability for Microwave Access (WiMax)
WLAN Wireless Local Area Network

The invention claimed is:

1. A method in a node, comprising:
coupling at least a portion of sets of information bits associated with each of a plurality of constituent polar codes to generate a spatially coupled polar code, each of the plurality of constituent polar codes having an associated block length and an associated set of information bits;
encoding a wireless transmission using the spatially coupled polar code;
transmitting the wireless transmission from the node to another node; and
the at least a portion of the sets of information bits associated with each of the plurality of constituent polar codes being coupled using a coupling matrix that specifies how information bits from a first constituent polar code of the plurality of constituent polar codes are coupled to one or more other constituent polar codes of the plurality of constituent polar code, and the coupling matrix being expressed as a block-wise upper triangular form.

2. The method of claim 1, wherein coupling at least a portion of the sets of information bits associated with each of the plurality of constituent polar codes to generate a spatially coupled polar code comprises:
using a first subset of information bits in a first set of information bits associated with a first constituent polar code to form one or more information bits of another set of information bits associated with another constituent polar code of the plurality of constituent polar codes.

3. The method of claim 1, wherein the coupling matrix comprises elements from a binary Galois field.

4. The method of claim 1, wherein a block length of the spatially coupled polar code is equal to the sum of the block length of each of the plurality of constituent polar codes.

5. The method of claim 1, wherein encoding a wireless transmission using the spatially coupled polar code comprises:

determining, for each of a plurality of polar encoders, an associated set of coupled information bits; and running each of the plurality of polar encoders by, for each of the plurality of polar encoders, putting the associated set of coupled information bits into the information bit locations based on an interleaving function and freezing the frozen bit locations to zero.

6. The method of claim 5, comprising puncturing a plurality of bits of an individual polar encoder of the plurality of polar encoders such that an output of the individual polar encoder has a length other than a power of 2.

7. The method of claim 5, comprising refraining from puncturing bits for individual polar encoders of the plurality of polar encoders such that an output of the individual polar encoder has a length that is a power of 2.

8. The method of claim 1, wherein:
each of the plurality of constituent polar codes has the same size;
the coupling matrix is a banded Toeplitz matrix; and
the spatially coupled polar code is a concatenated convolutional-polar code.

9. The method of claim 1, wherein:
a first subset of information bits in a first set of information bits associated with a first constituent polar code are identical to another subset of information bits in another set of information bits associated with another constituent polar code; a plurality of information bits having high reliability in the first set of information bits associated with the first constituent polar code are coupled with other information bits having low reliability in the other set of information bits associated with the other constituent polar code; and the spatially coupled polar code comprises a parallel concatenated polar code.

10. The method or claim 1, comprising transmitting the wireless transmission encoded using the spatially coupled polar code.

11. A method in a node, comprising:
receiving a wireless transmission from another node the wireless transmission encoded using a spatially coupled polar code, the spatially coupled polar code comprising a plurality of sets of information bits at least a portion of which have been coupled, each set of information bits associated with one of a plurality of constituent polar codes, the at least a portion of the sets of information bits associated with each of the plurality of constituent polar codes being coupled using a coupling matrix that specifies how information bits from a first constituent polar code of the plurality of constituent polar codes are coupled to one or more other constituent polar codes of the plurality of constituent polar code, and the coupling matrix being expressed as a block-wise upper triangular form; and
decoding the wireless transmission encoded using the spatially coupled polar code using feedforward decoding.

12. The method of claim 11, wherein decoding the wireless transmission encoded using the spatially coupled polar code using feedforward decoding comprises: decoding a plurality of coupled information bit vectors; decoding a first information bit; and decoding one or more remaining information bits sequentially.

13. The method of claim 12, wherein decoding the plurality of coupled information bit vectors comprises:
running each of a plurality of polar decoders in parallel, wherein each of the plurality of polar decoders is associated with one of the plurality of constituent polar codes.

14. The method of claim 12, wherein decoding the plurality of coupled information bit vectors comprises:
running a plurality of polar decoders in series, the plurality of polar decoders comprising a first polar decoder, wherein each of the plurality of polar decoders is associated with one of the plurality of constituent polar codes; generating, by the first polar decoder, one or more of soft output information and hard output information; and
providing, from the first polar decoder to at least one subsequent polar decoder in a series of the plurality of polar decoders, one or more of the soft output information and hard output information generated by the first polar decoder.

15. The method of claim 14, wherein the soft output information comprises a log likelihood ratio.

16. The method of claim 11, wherein a block length of the spatially coupled polar code is equal to the sum of the block length of each of the plurality of constituent polar codes.

17. The method of claim 11, wherein the spatially coupled polar code is a concatenated convolutional-polar code.

18. The method of claim 11, wherein the spatially coupled polar code is a parallel concatenated polar code.

19. A node, comprising:
processing circuitry, the processing circuitry configured to:
couple at least a portion of sets of information bits associated with each of a plurality of constituent polar codes to generate a spatially coupled polar code, each of the plurality of constituent polar codes having an associated block length and an associated set of information bits;
encode a wireless transmission using the spatially coupled polar code;
transmit the wireless transmission from the node to another node; and
the at least a portion of the sets of information bits associated with each of the plurality of constituent polar codes being coupled using a coupling matrix that specifies how information bits from a first constituent polar code of the plurality of constituent polar codes are coupled to one or more other constituent polar codes of the plurality of constituent polar code, and the coupling matrix being expressed as a block-wise upper triangular form.

20. The node of claim 19, wherein the processing circuitry configured to couple at least a portion of the sets of information bits associated with each of the plurality of constituent polar codes to generate a spatially coupled polar code comprises processing circuitry configured to:
use a first subset of information bits in a first set of information bits associated with a first constituent polar code to form one or more information bits of another set of information bits associated with another constituent polar code of the plurality of constituent polar codes.

21. The node of claim 19, wherein the coupling matrix comprises elements from a binary Galois field.

22. A node, comprising:
processing circuitry, the processing circuitry configured to:
receive a wireless transmission from another node the wireless transmission encoded using a spatially coupled polar code, the spatially coupled polar code comprising a plurality of sets of information bits at least a portion of which have been coupled, each set of information bits associated with one of a plurality of constituent polar codes, the at least a portion of the sets of information bits associated with each of the plurality of constituent polar codes being coupled using a coupling matrix that specifies how information bits from a first constituent polar code of the plurality of constituent polar codes are coupled to one or more other constituent polar codes of the plurality of constituent polar code, and the coupling matrix being expressed as a block-wise upper triangular form; and decode the wireless transmission encoded using the spatially coupled polar code using feedforward decoding.

* * * * *